(12) United States Patent
Sawada et al.

(10) Patent No.: US 11,217,512 B2
(45) Date of Patent: Jan. 4, 2022

(54) SEMICONDUCTOR MODULE

(71) Applicant: SUMITOMO ELECTRIC INDUSTRIES, LTD., Osaka (JP)

(72) Inventors: Kenichi Sawada, Osaka (JP); Jiro Shinkai, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/758,206

(22) PCT Filed: Aug. 23, 2018

(86) PCT No.: PCT/JP2018/031190
§ 371 (c)(1),
(2) Date: Apr. 22, 2020

(87) PCT Pub. No.: WO2019/087540
PCT Pub. Date: May 9, 2019

(65) Prior Publication Data
US 2020/0321271 A1     Oct. 8, 2020

(30) Foreign Application Priority Data

Oct. 30, 2017   (JP) .............................. JP2017-208879

(51) Int. Cl.
| | | |
|---|---|---|
| *H01L 23/495* | (2006.01) | |
| *H01L 23/373* | (2006.01) | |
| *H01L 23/043* | (2006.01) | |
| *H01L 23/31* | (2006.01) | |
| *H01L 23/498* | (2006.01) | |
| *H01L 29/16* | (2006.01) | |
| *H01L 25/07* | (2006.01) | |
| *H01L 25/00* | (2006.01) | |
| *H01L 25/18* | (2006.01) | |

(52) U.S. Cl.
CPC ...... *H01L 23/49562* (2013.01); *H01L 23/043* (2013.01); *H01L 23/373* (2013.01); *H01L 29/1608* (2013.01)

(58) Field of Classification Search
CPC .................................................. H01L 23/49833
See application file for complete search history.

(56) References Cited

U.S. PATENT DOCUMENTS

2011/0037166 A1   2/2011   Ikeda et al.
2012/0306086 A1   12/2012  Sugimura et al.
(Continued)

FOREIGN PATENT DOCUMENTS

JP   2012-253125   12/2012
JP   2014-060410   4/2014
(Continued)

*Primary Examiner* — Omar F Mojaddedi
(74) *Attorney, Agent, or Firm* — IPUSA, PLLC

(57) ABSTRACT

A semiconductor module includes a semiconductor chip having a first surface provided with a first electrode pad and a second surface, opposite to the first surface, provided with a second electrode pad, a first substrate connected to the first electrode pad, a second substrate provided on the side of the second surface, and a conductor section, electrically connecting the second electrode pad and the second substrate, and having a size greater than the second electrode pad in a plan view viewed from the side of the second substrate.

26 Claims, 31 Drawing Sheets

(56) References Cited

U.S. PATENT DOCUMENTS

| | | | |
|---|---|---|---|
| 2014/0054751 A1* | 2/2014 | Shikano | H01L 23/367 257/621 |
| 2015/0243640 A1* | 8/2015 | Horio | H01L 24/49 257/701 |
| 2015/0294919 A1 | 10/2015 | Notsu | |
| 2017/0133294 A1* | 5/2017 | Ikeda | H01L 23/24 |
| 2019/0227115 A1* | 7/2019 | Takematsu | H01L 23/29 |

FOREIGN PATENT DOCUMENTS

| | | |
|---|---|---|
| JP | 2014-082233 | 5/2014 |
| JP | 2017-054877 | 3/2017 |

* cited by examiner

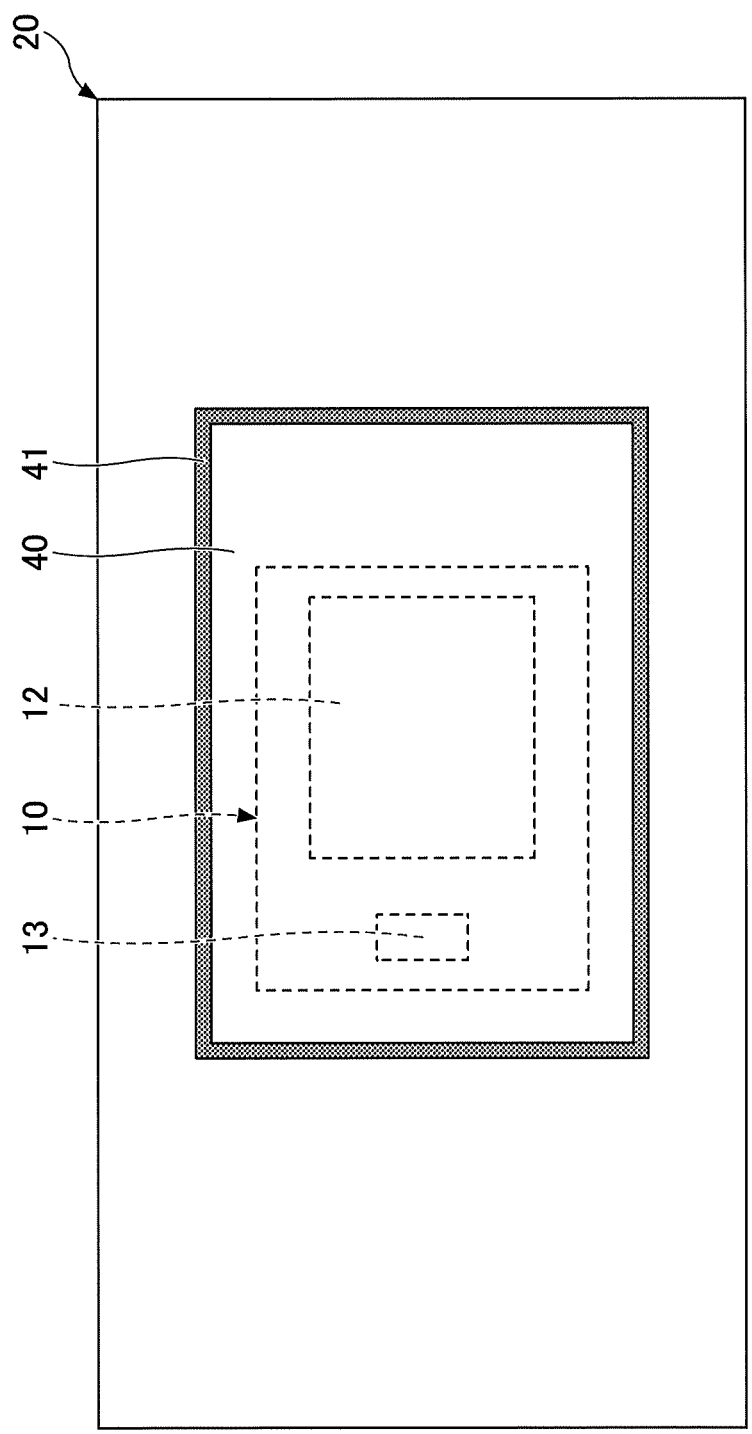

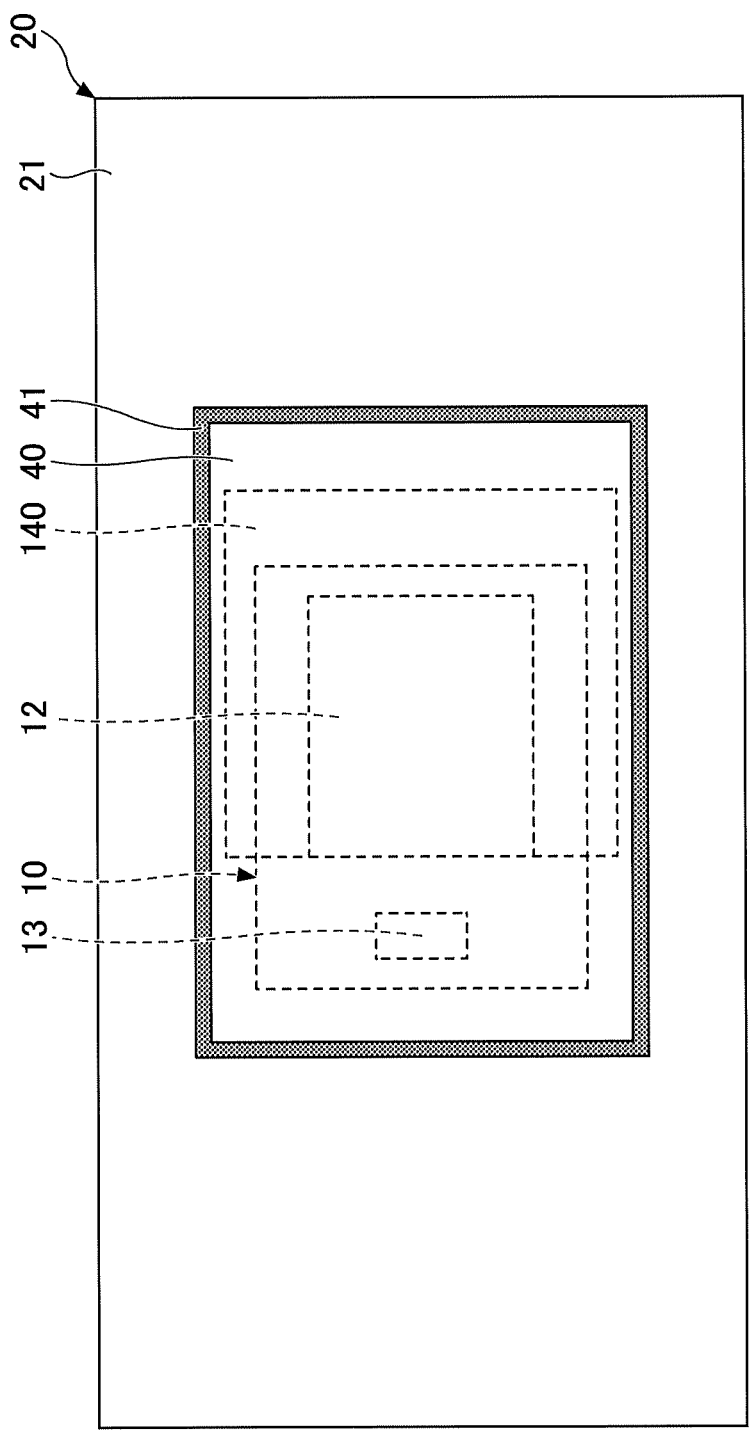

SEMICONDUCTOR MODULE

TECHNICAL FIELD

The disclosure relates to a semiconductor module.

This application is based upon and claims priority to Japanese Patent Application No. 2017-208879, filed on Oct. 30, 2017, the entire contents of which are incorporated herein by reference.

BACKGROUND ART

Semiconductor modules including a semiconductor chip in which a large current can flow, are used in electric vehicles or the like, and power applications or the like. In such semiconductor modules, heat is generated when the large current flows, and for this reason, the semiconductor chip is mounted on one surface of a wiring substrate, and a heat sink for heat dissipation is provided on the other surface of the wiring substrate.

PRIOR ART DOCUMENTS

Patent Documents

Patent Document 1: Japanese Laid-Open Patent Publication No. 2012-253125

Patent Document 2: Japanese Laid-Open Patent Publication No. 2014-082233

DISCLOSURE OF THE INVENTION

According to one aspect of the embodiments, a semiconductor module includes a semiconductor chip having a first surface provided with a first electrode pad, and a second surface, opposite to the first surface, provided with a second electrode pad; a first substrate connected to the first electrode pad; a second substrate provided on the side of the second surface; and a conductor section, electrically connecting the second electrode pad and the second substrate, and having a size greater than the second electrode pad in a plan view viewed from the side of the second substrate.

BRIEF DESCRIPTION OF DRAWINGS

FIG. 3 is a diagram for explaining the semiconductor module according to the first embodiment of the present disclosure.

FIG. 13 is a diagram for explaining the semiconductor module according to the second embodiment of the present disclosure.

MODE OF CARRYING OUT THE INVENTION

Figure 1:
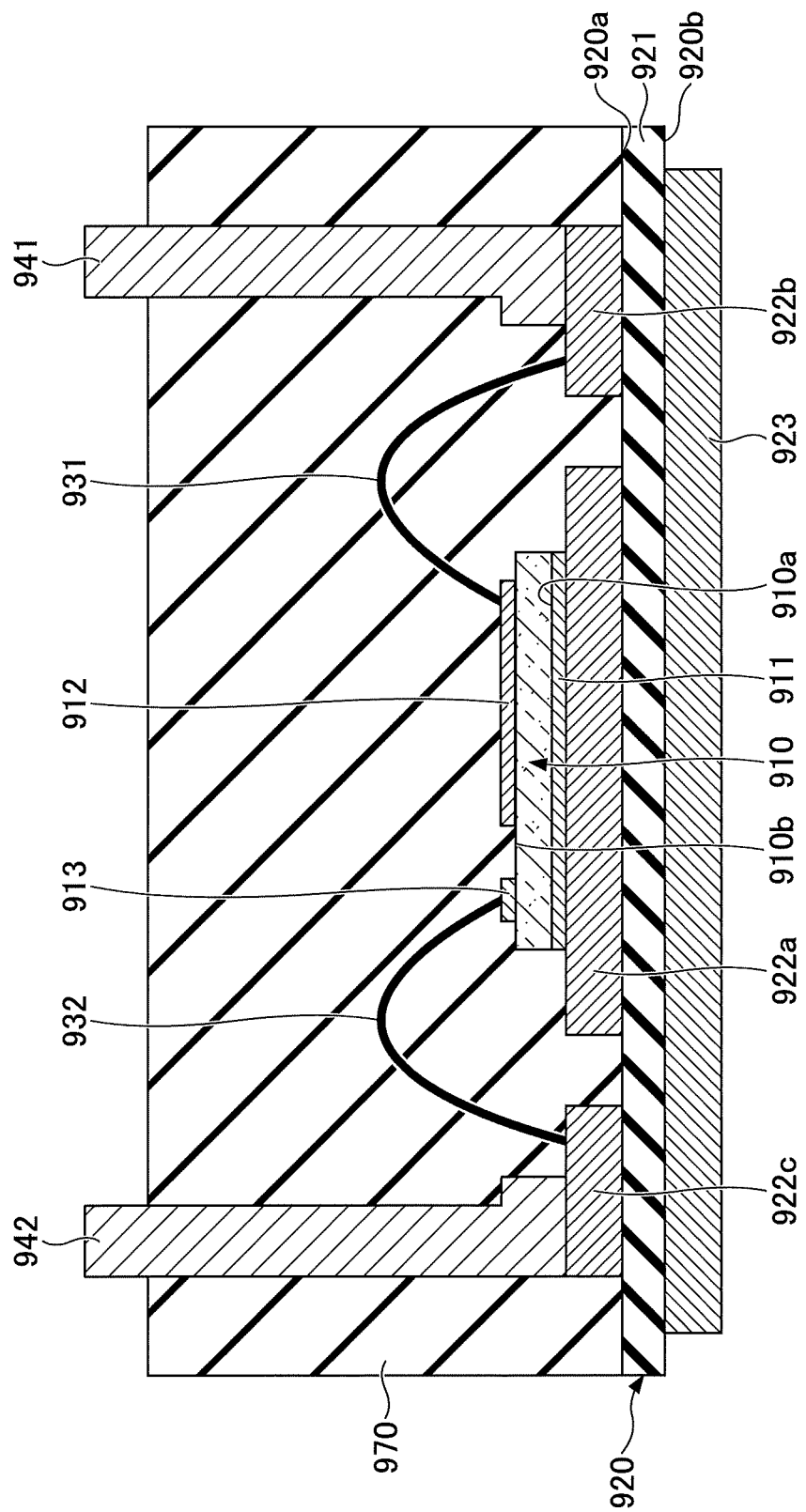
FIG. 1 is a diagram illustrating a structure of a semiconductor module.

There are demands to cause a large current to flow in a semiconductor module, and for this reason, a semiconductor chip in which large current can flow, is used and mounted in the semiconductor module. However, because a large amount of heat is generated from the semiconductor chip in which the large current can flow, an efficient heat dissipation is required. Hence, there are demands for a semiconductor module that can efficiently dissipate the heat generated from the semiconductor chip. One object of the present disclosure is to efficiently dissipate the heat generated from the semiconductor chip.

According to the present disclosure, it is possible to efficiently dissipate the heat generated from the semiconductor chip.

Embodiments will be described in the following.

DESCRIPTION OF EMBODIMENTS OF PRESENT DISCLOSURE

First, embodiments of the present disclosure will be described in order. In the following description, the same or corresponding elements are designated by the same reference numerals, and a repeated description of such elements will be omitted.

[1] A semiconductor module according to one embodiment of the present disclosure includes a semiconductor chip having a first surface provided with a first electrode pad, and a second surface, opposite to the first surface, provided with a second electrode pad; a first substrate connected to the first electrode pad; a second substrate provided on the side of the second surface; and a conductor section, electrically connecting the second electrode pad and the second substrate, and having a size greater than the second electrode pad in a plan view viewed from the side of the second substrate.

A semiconductor module, that can cope with high-voltage and high-current, uses a semiconductor chip that can cope with high-voltage and high-current, but the semiconductor chip that can cope with the high-voltage and high-current generates a large amount of heat and reaches a high temperature when the large current flows. Accordingly, in order to obtain the semiconductor module that can cope with the high-voltage and high-current, it is not only important to use the semiconductor chip that can cope with the high-voltage and high-current, but extremely important to dissipate heat from the semiconductor module. In other words, as the requirements for the semiconductor chip to cope with the high-voltage and high-current become more severe, the more important the heat dissipation from the semiconductor chip becomes. As a result of intensive studies conducted by the present inventors, a semiconductor module having a structure with an improved heat dissipation efficiency was conceived, capable of dissipating heat from both surfaces of the semiconductor chip. The disclosure of this application is based on such findings and conceptions of the present inventors.

[2] The size of the conductor section is greater than the semiconductor chip in the plan view viewed from the side of the second substrate.

[3] A third electrode pad is provided on the second surface, the first electrode terminal is electrically connected to the third electrode pad, and the first electrode terminal has a flat shape, and is set parallel to the first substrate and the second substrate, between the first substrate and the second substrate.

[4] The conductor section and the third electrode pad overlap in the plan view viewed from the side of the second substrate.

[5] A frame section, formed by a material different from that of the conductor section, is provided on a portion of a periphery of the conductor section.

[6] A metal plate is electrically connected to the second electrode pad that is provided on the second surface of the semiconductor chip, and the metal plate and the conductor section are electrically connected.

[7] A second electrode terminal is electrically connected to the second electrode pad that is provided on the second surface of the semiconductor chip, and the second electrode terminal and the conductor section are electrically connected.

[8] The semiconductor chip is formed by a material including SiC.

DETAILS OF EMBODIMENTS OF PRESENT DISCLOSURE

The embodiment of the present disclosure will be described in detail in the following, however, the present disclosure is not limited to these embodiments.

First Embodiment

First, the above-mentioned semiconductor module will be described in more detail, by referring to FIG. 1. The semiconductor module illustrated in FIG. 1 includes a semiconductor chip 910 mounted on a circuit board 920. The circuit board 920 includes an interconnect layer 922a formed on a first surface 920a that forms one surface of an insulating substrate 921, and a heat dissipation layer 923 formed on a second surface 920b that forms the other surface of the insulating substrate 921. The semiconductor chip 910 is mounted on the interconnect layer 922a, and the heat dissipation layer 923 is connected to a heat sink that is not illustrated.

The semiconductor chip 910 includes a drain electrode pad 911 provided on a first surface 910a that is one surface, and a source electrode pad 912 and a gate electrode pad 913 provided on a second surface 910b that is the other surface.

Accordingly, the interconnect layer 922a provided on the first surface 920a of the circuit board 920, and the drain electrode pad 911 provided on the first surface 910a of the semiconductor chip 910, are electrically connected by a solder or the like that is not illustrated. In addition, the source electrode pad 912 provided on the second surface 910b of the semiconductor chip 910 is electrically connected to the interconnect layer 922b provided on the first surface 920a of the circuit board 920 by a bonding wire 931. The gate electrode pad 913 provided on the second surface 910b of the semiconductor chip 910 is electrically connected to an interconnect layer 922c provided on the first surface 920a of the circuit board 920 by a bonding wire 932. An electrode terminal 941 is electrically connected to the interconnect layer 922b by a solder or the like that is not illustrated, and an electrode terminal 942 is electrically connected to the interconnect layer 922c by a solder or the like that is not illustrated. On the side of the first surface 920a of the circuit board 920 in the semiconductor module illustrated in FIG. 1, the entire semiconductor chip 910 is covered by a resin material 970.

In the semiconductor module illustrated in FIG. 1, heat generated from the semiconductor chip 910 is dissipated by the heat sink that is not illustrated, via the heat dissipation layer 923 of the circuit board 920 that is provided on the side of the first surface 910a of the semiconductor chip 910.

There are demands for the semiconductor module of the type described above to cope with high-voltage and high-current, and for this reason, the semiconductor chip 910 that is used also copes with the high-voltage and high-current. The semiconductor chip 910 that can cope with the high-voltage and high-current includes a semiconductor chip using Si as the semiconductor material, and semiconductor chips using SiC or the like as the semiconductor material. Because SiC has a wider band gap when compared to that of Si, SiC is suited for use as the semiconductor material when coping with the high-voltage and high-current.

However, in general, when the current flowing in the semiconductor chip 910 increases, the heat generated from the semiconductor chip 910 increases, and there are cases where the heat dissipation may become insufficient according to the semiconductor module having the structure illustrated in FIG. 1. In other words, even when it is possible to obtain the semiconductor chip that can cope with the high-voltage and high-current, there are cases where this semiconductor chip cannot be used in the semiconductor module from a viewpoint of providing sufficient heat dissipation.

A semiconductor module according to this embodiment has a structure that can provide sufficient heat dissipation, even when the semiconductor chip that can cope with the high-voltage and high-current is used in the semiconductor module.

(Semiconductor Module)

Figure 2:
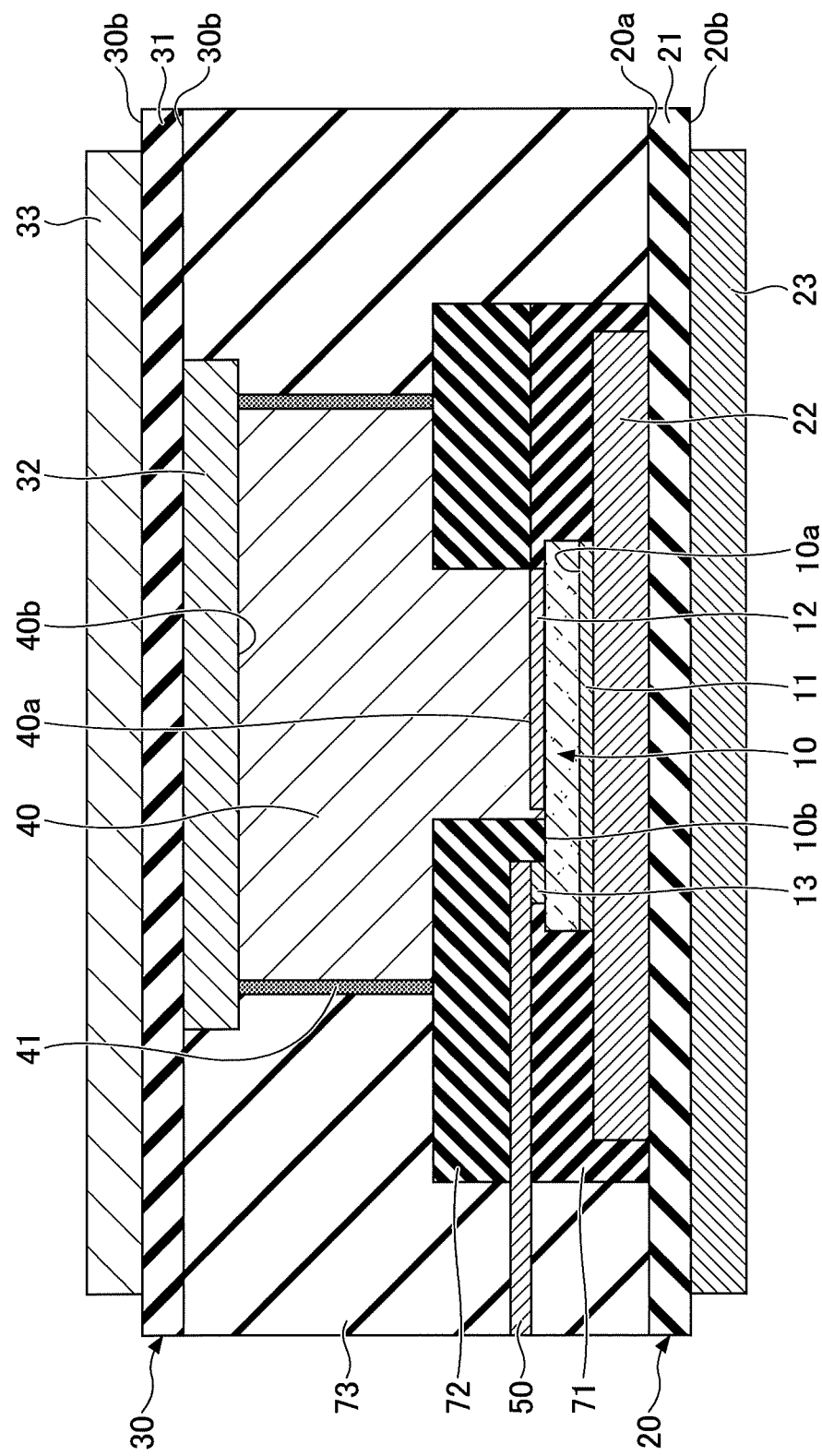
FIG. 2 is a diagram illustrating a structure of the semiconductor module according to a first embodiment of the present disclosure.

Next, the semiconductor module according to this embodiment will be described, by referring to FIG. 2. The semiconductor module according to this embodiment includes a semiconductor chip 10, that is a semiconductor element, a first substrate 20, a second substrate 30, or the like.

The semiconductor chip 10 is formed by Si or SiC, and a drain electrode pad 11 is formed on a first surface 10a that forms one surface, and a source electrode pad 12 and a gate electrode pad 13 are formed on a second surface 10b that forms the other surface. From a viewpoint of efficiency and reduced size, the semiconductor chip 10 is preferably formed by SiC. In this application, the drain electrode may be referred to as a first electrode, the source electrode may be referred to as a second electrode, and the gate electrode may be referred to as a third electrode. In this embodiment, a description will be given for the case where the semiconductor chip 10 is a Field Effect Transistor (FET), however, the semiconductor chip 10 may be a transistor. In the case where the semiconductor chip 10 is the transistor, a collector electrode forms the first electrode, an emitter electrode forms the second electrode, and a base electrode forms the third electrode.

The first substrate 20 includes an insulating substrate 21 formed by an insulator, a metal layer 22 forming an interconnect layer formed on a first surface 20a that forms one surface, and a metal layer 23 forming a heat dissipation layer formed on a second surface 20b that forms the other surface. The drain electrode pad 11 of the semiconductor chip 10 is electrically connected to the metal layer 22 formed on the first surface 20a of the first substrate 20, by a solder or the like that is not illustrated.

The second substrate 30 includes an insulating substrate 31 formed by an insulator, a metal layer 32 forming an interconnect layer formed on a first layer 30a that forms one surface, and a metal layer 33 forming a heat dissipation layer formed on a second surface 30b that forms the other surface.

The insulating substrate 21 and the insulating substrate 31 are formed by an insulating material, such as ceramics or the like, and the metal layers 22, 23, 32, and 33 are formed by copper (Cu) or the like.

A gate electrode terminal 50 is electrically connected to the gate electrode pad 13 of the semiconductor chip 10 by a solder or the like that is not illustrated. The gate electrode terminal 50 is formed to an elongated flat shape by copper (Cu) or the like, and is electrically connected to the gate electrode pad 13 in a state where the gate electrode terminal 50 is arranged between the first substrate 20 and the second substrate 30, and parallel to the first substrate 20 and the second substrate 30. In this application, the gate electrode terminal 50 may be referred to as a first electrode terminal. In addition, in this specification, the term parallel state does not refer to a strictly parallel state, geometrically, and may include a tolerable dimensional error or the like generated during manufacture, such that the parallel state has a range with which effects of the present invention are obtainable.

The semiconductor chip 10 is covered by resin layers 71 and 72 that are formed by an insulating resin material, excluding a region formed with the source electrode pad 12. A source conductor section 40, made of a conductive material, such as a metal material or the like, for example, is formed on the source electrode pad 12 of the semiconductor chip 10. The source conductor section 40 is electrically connected to the source electrode pad 12 of the semiconductor chip on one side 40a thereof, and is electrically connected to the metal layer 32 on the first surface 30a of the second substrate 30 on the other side 40b thereof. The source conductor section 40 is formed by a highly conductive material which, in general, also has a high thermal conductivity. Accordingly, the source conductor section 40 electrically connects the source electrode pad 12 of the semiconductor chip 10 and the metal layer 32 of the second substrate 30, and heat generated from the semiconductor chip 10 can be efficiently dissipated to the second substrate 30 via the source conductor section 40.

The source conductor section 40 is formed so that the other side 40b connected to the metal layer 32 on the first surface 30a of the second substrate 30 has an area greater than an area of the one side 40a connected to the source electrode pad 12 of the semiconductor chip 10. More particularly, the area of the other side 40b of the source conductor section 40 is greater than the area of the semiconductor chip 10, and the entire semiconductor chip 10 is covered by the source conductor section 40, above the semiconductor chip 10. Accordingly, the gate electrode pad 13 of the semiconductor chip 10 is covered by the source conductor section 40 above the gate electrode pad 13.

FIG. 3 illustrates a positional relationship between the semiconductor chip 10 and the source conductor section 40 in the plan view viewed from the side of the second substrate 30, in the semiconductor module according to this embodiment. In FIG. 3, the illustration of the second substrate 30, the gate electrode terminal 50, the resin layer 72, or the like is omitted for the sake of convenience. In the semiconductor module according to this embodiment, the entire semiconductor chip 10 is covered by the source conductor section 40 in the plan view viewed from the side of the second substrate 30. Accordingly, the gate electrode pad 13 of the semiconductor chip 10 is also covered by the source conductor section 40. In this embodiment, the semiconductor chip 10 has a size that is approximately 10 mm×approximately 10 mm when the semiconductor material is Si, and a size that is approximately 5 mm×approximately 5 mm when the semiconductor material is SiC, and the size of the source conductor section 40 in the plan view is approximately 15 mm×approximately 20 mm.

As will be described later, the source conductor section 40 is formed by sintering a silver paste or the like, and thus, a frame section 41 for forming the source conductor section 40 is provided on a portion in a periphery of the source conductor section 40. Because the frame section 41 is for forming the source conductor section 40, normally, the frame section 41 is formed by a material different from that of the source conductor section 40. The frame section 41 may be formed by an insulator, or a metal or the like. In addition, the semiconductor module according to this embodiment may have a structure in which this frame section 41 is removed. Further, a periphery of the frame section 41 or the like, between the first substrate 20 and the second substrate 30, is bound by the insulating resin layer 71 and the insulating resin layer 72, and an insulating resin section 73 that is formed by an insulating resin material.

In the semiconductor module according to this embodiment, a heat sink that is not illustrated is connected to the metal layer 23 on the second surface 20b of the first substrate 20, and similarly, a heat sink that is not illustrated is connected to the metal layer 33 on the second surface 30b of the second substrate 30. Accordingly, the heat generated from the semiconductor chip 10 is dissipated from the first surface 10a of the semiconductor chip 10 to the heat sink that is not illustrated via the first substrate 20, and is dissipated from the second surface 10b of the semiconductor chip 10 to the heat sink that is not illustrated via the second substrate 30.

In the semiconductor module illustrated in FIG. 1, the heat generated from the semiconductor chip 910 can only be dissipated from the first surface 910a of the semiconductor chip 910, that is, only from one surface. In the semiconductor module according to this embodiment, however, the heat generated from the semiconductor chip 10 can be dissipated from both the first surface 10a and the second surface 10b of the semiconductor chip 10. For this reason, compared to the semiconductor module having the structure illustrated in FIG. 1, the semiconductor module according to this embodiment can improve the heat dissipation efficiency of the semiconductor chip 10.

In addition, the source conductor section 40 that is electrically connected to the source electrode pad 12 on the second surface 10b of the semiconductor chip 10 has a large area and a low thermal resistance, and thus, it is possible to efficiently dissipate the heat on the side of the second surface 10b of the semiconductor chip 10.

Further, according to this embodiment, the gate electrode terminal 50 is directly and electrically connected to the gate electrode pad 13 of the semiconductor chip 10, the source conductor section 40 is directly and electrically connected to the source electrode pad 12, and no bonding wire is used. Hence, it is unnecessary to secure a region for forming the bonding wire, and a thickness of the semiconductor module can be reduced. In other words, it is possible to arrange the first substrate 20 and the second substrate 30 close to each other. By reducing the thickness of the semiconductor module, it is not only possible to reduce the size of the semiconductor module, but also reduce a height of the source conductor section 40. For this reason, a distance from the semiconductor chip 10 to the second substrate 20 can be shortened, to further improve the heat dissipation performance.

(Method of Manufacturing Semiconductor Module)

Next, a method of manufacturing the semiconductor module according to this embodiment will be described, by referring to FIG. 4A through FIG. 11B. FIG. 4A through FIG. 11A are top views, and FIG. 4B through FIG. 11B are cross sectional views.

Figure 4A:
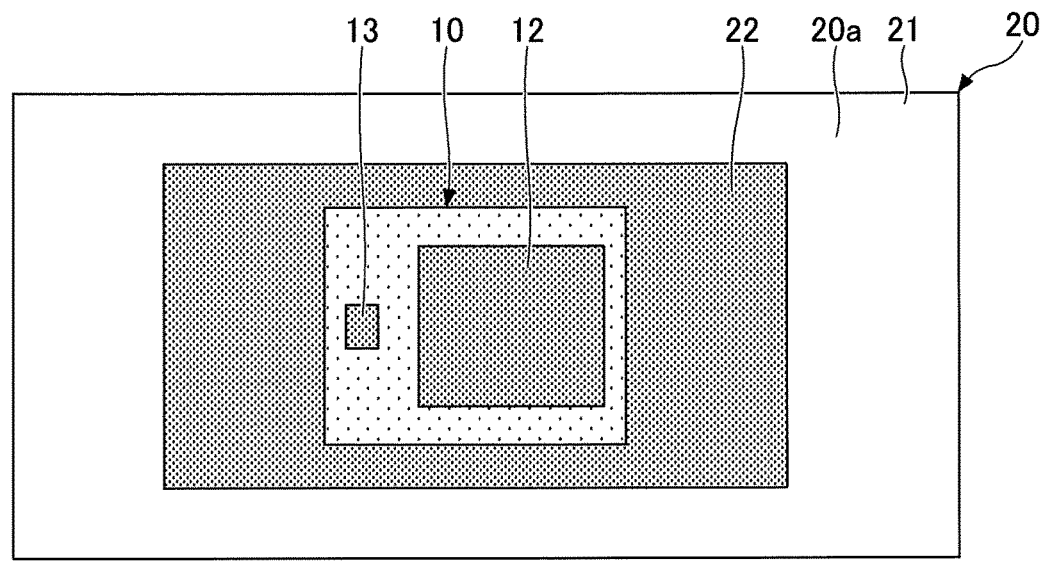
FIG. 4A is a diagram (1) for explaining processes of a method of manufacturing the semiconductor module according to the first embodiment of the present disclosure.
Figure 4B:
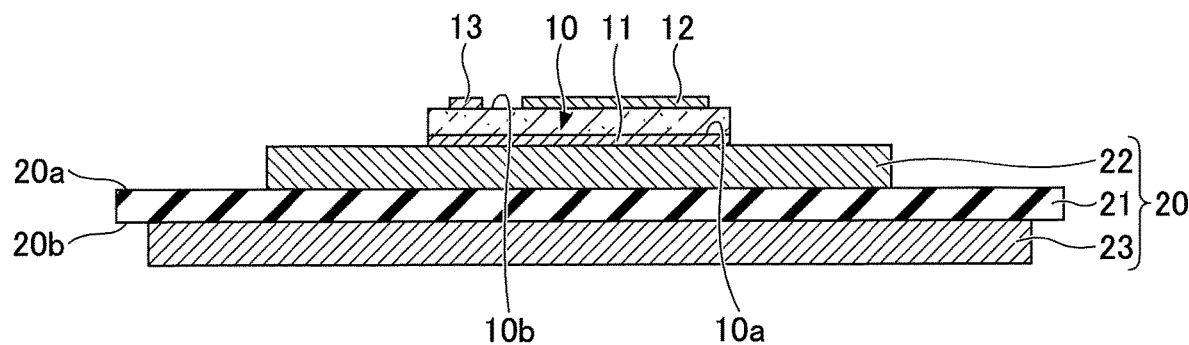
FIG. 4B is a diagram (2) for explaining the processes of the method of manufacturing the semiconductor module according to the first embodiment of the present disclosure.

First, as illustrated in FIG. 4A and FIG. 4B, the drain electrode pad 11 formed on the first surface 10a of the semiconductor chip 10 is bonded to the metal layer 22 forming the interconnect layer on the first surface 20a of the first substrate 20, by a solder or the like that is not illustrated. Hence, the metal layer 22 of the first substrate 20 and the drain electrode pad 11 of the semiconductor chip 10 are electrically connected. The solder that is used to electrically connect the metal layer 22 and the drain electrode pad 11 is a solder including SuSb or the like, and a bonding temperature of this solder is approximately 250° C.

Figure 5A:
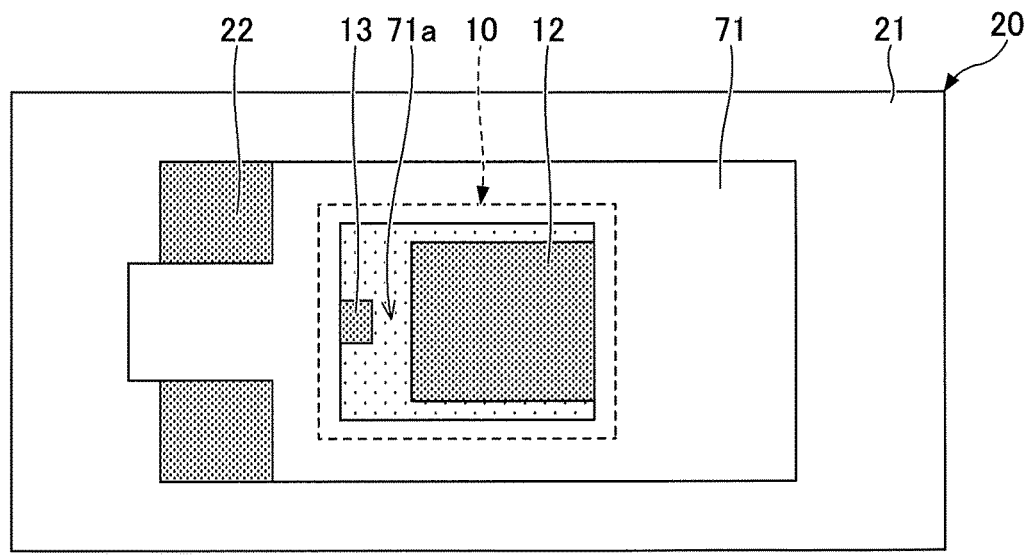
FIG. 5A is a diagram (3) for explaining the processes of the method of manufacturing the semiconductor module according to the first embodiment of the present disclosure.
Figure 5B:
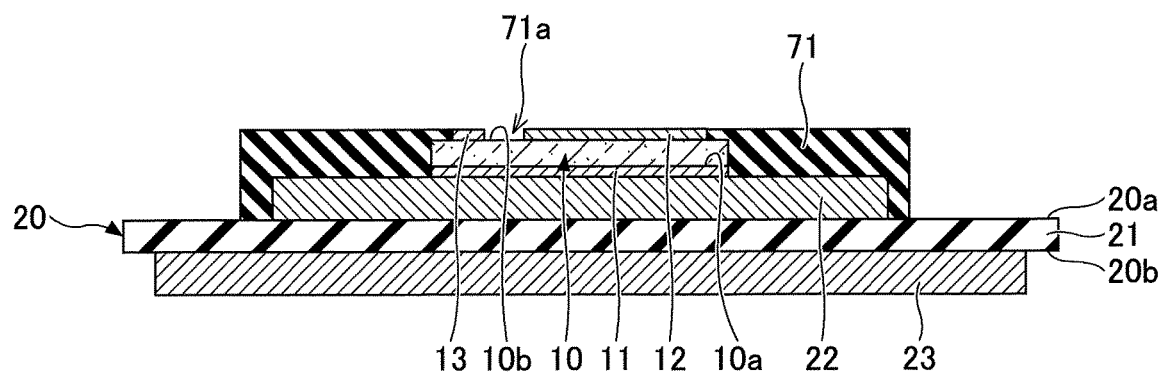
FIG. 5B is a diagram (4) for explaining the processes of the method of manufacturing the semiconductor module according to the first embodiment of the present disclosure.

Next, as illustrated in FIG. 5A and FIG. 5B, the resin layer 71 including an opening 71a is formed in a region on the second surface 10b of the semiconductor chip 10 where the source electrode pad 12 and the gate electrode pad 13 are formed. The resin layer 71 is formed by an insulating material. More particularly, a resist pattern, that is not illustrated and including an opening in a region where the resin layer 71 is formed, is formed, and a resin material for forming the resin layer 71 is coated thereon. The resist pattern is formed by a material that repels this resin material, and the resin material adhered on the resist pattern is repelled. Thereafter, the resist pattern that is not illustrated is removed by an organic solvent or the like, and the resin material is cured by applying heat, to form the insulating resin layer 71. In this case, the resin material that is used for the resin layer 71 is an epoxy resin, for example, and a curing temperature of the epoxy resin is approximately 200° C. Hence, the resin layer 71, including the opening 71a, is formed. The resin layer 71 covers the entire surface of the semiconductor chip 10, excluding the region where the opening 71a is formed, and the resin layer 71 also covers a portion of the metal layer 22 in the periphery of the semiconductor chip 10. The resin layer 71 is formed to a height that is approximately the same as those of the source electrode pad 12 and the gate electrode pad 13 on the second surface 10b of the semiconductor chip 10.

Figure 6A:
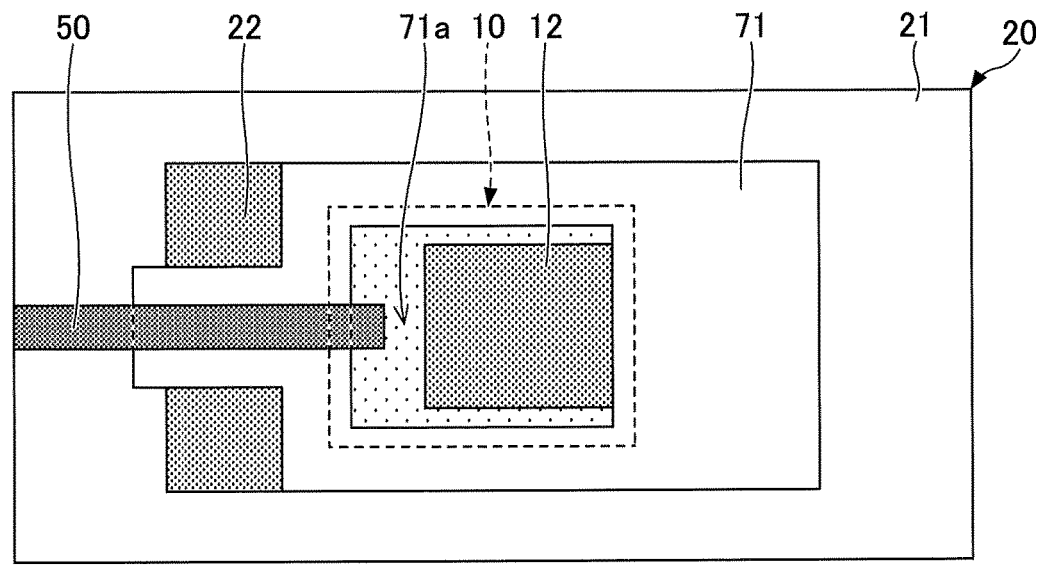
FIG. 6A is a diagram (5) for explaining the processes of the method of manufacturing the semiconductor module according to the first embodiment of the present disclosure.
Figure 6B:
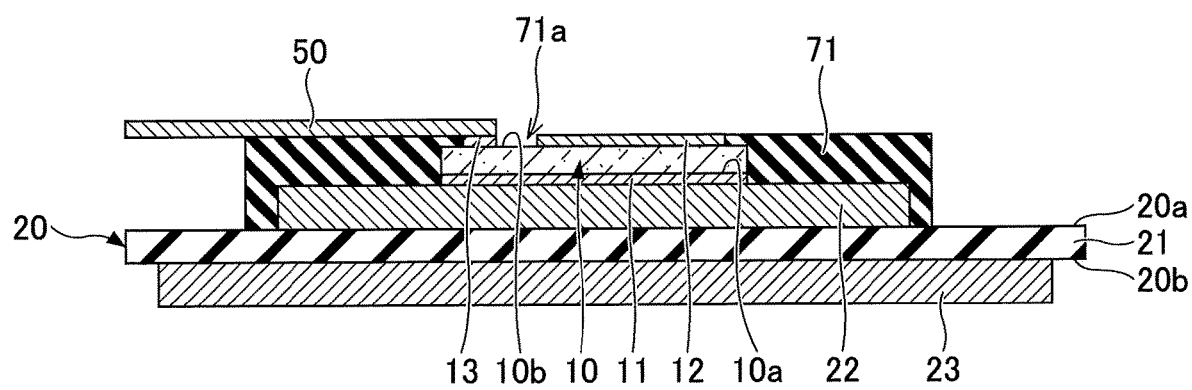
FIG. 6B is a diagram (6) for explaining the processes of the method of manufacturing the semiconductor module according to the first embodiment of the present disclosure.

Next, as illustrated in FIG. 6A and FIG. 6B, the gate electrode terminal 50 is bonded to the gate electrode pad 13 by a solder or the like. Hence, the gate electrode pad 13 and the gate electrode terminal 50 are electrically connected. The gate electrode terminal 50 is formed to the elongated flat shape, and in a state where the gate electrode terminal 50 is arranged on the resin layer 71, a vicinity of one end part is bonded to the gate electrode pad 13, and the other end part extends to a vicinity of the left side of the first substrate 20 in FIG. 6A and FIG. 6B. The solder that is used to electrically connect the gate electrode terminal 50 and the gate electrode pad 13 is a solder including SuCu or the like, and a bonding temperature of this solder is approximately 230° C.

Figure 7A:
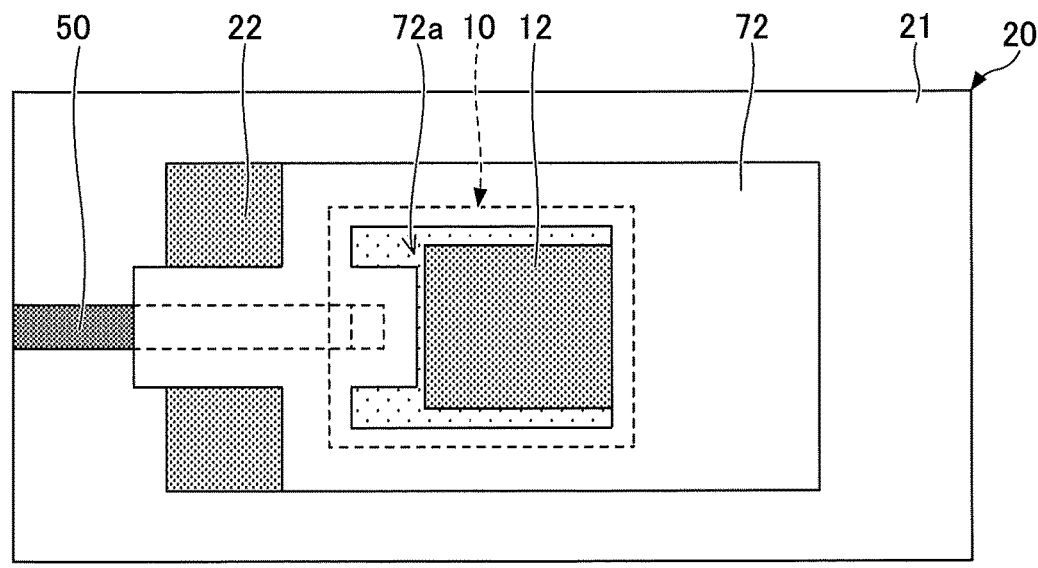
FIG. 7A is a diagram (7) for explaining the processes of the method of manufacturing the semiconductor module according to the first embodiment of the present disclosure.
Figure 7B:
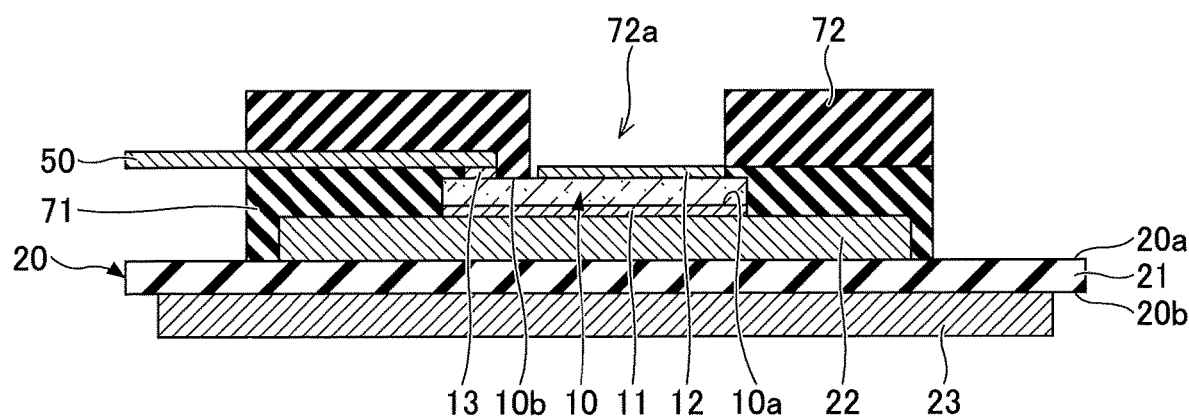
FIG. 7B is a diagram (8) for explaining the processes of the method of manufacturing the semiconductor module according to the first embodiment of the present disclosure.

Next, as illustrated in FIG. 7A and FIG. 7B, the resin layer 72 is formed on the resin layer 71, and the gate electrode terminal 50 on the resin layer 71. The resin layer 72 is formed by an insulating material. More particularly, a resist pattern, that is not illustrated and including an opening in a region where the resin layer 72 is formed, is formed, and a resin material for forming the resin layer 72 is coated thereon. The resist pattern is formed by a material that repels this resin material, and the resin material adhered on the resist pattern is repelled. Thereafter, the resist pattern that is not illustrated is removed by an organic solvent or the like, and the resin material is cured by applying heat, to form the insulating resin layer 72. The resin material that is used for the resin layer 72 is an epoxy resin, for example, and the curing temperature of the epoxy resin is approximately 200° C. Hence, the resin layer 72 is formed on the resin layer 71, and the gate electrode terminal 50 on the insulating layer 71. An opening 72a in the resin layer 72 covers the gate electrode terminal 50, and is narrower than the opening 71a in the resin layer 71, and thus, the source electrode pad 12 on the second surface 10b of the semiconductor chip 10 is exposed at the opening 72a in the resin layer 72 and the opening 71a in the resin layer 71. The resin layer 72 is formed to have a height of approximately 3 mm to approximately 4 mm from the second surface 10b of the semiconductor chip 10.

Figure 8A:
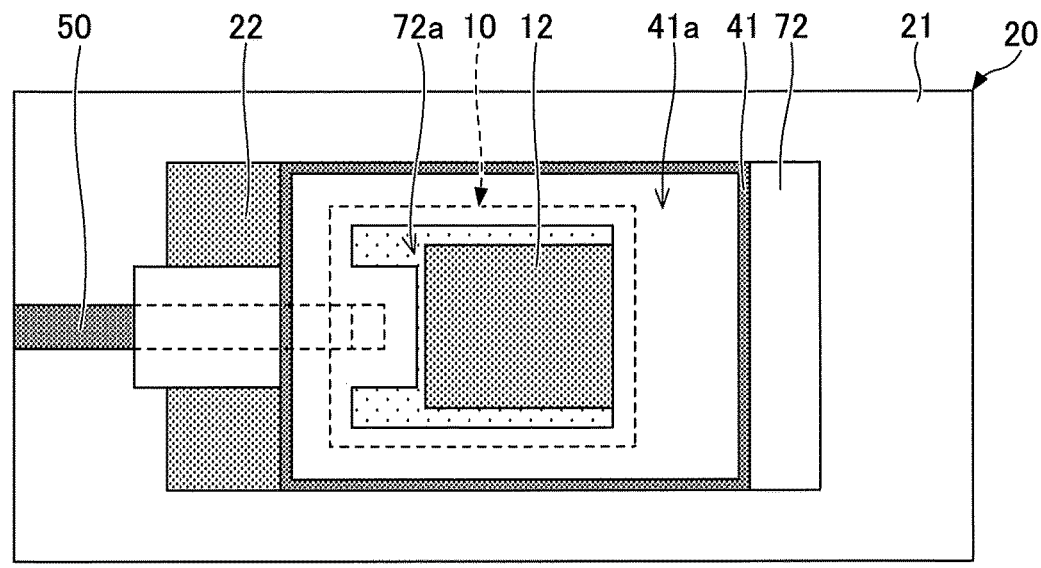
FIG. 8A is a diagram (9) for explaining the processes of the method of manufacturing the semiconductor module according to the first embodiment of the present disclosure.
Figure 8B:
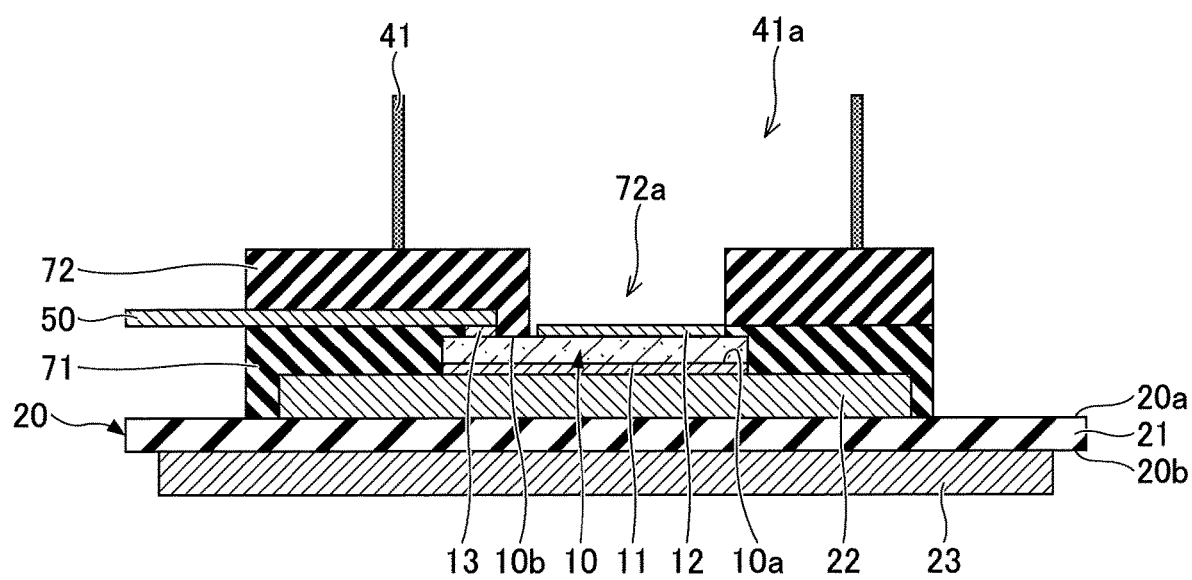
FIG. 8B is a diagram (10) for explaining the processes of the method of manufacturing the semiconductor module according to the first embodiment of the present disclosure.

Next, as illustrated in FIG. 8A and FIG. 8B, the frame section 41 is bonded onto the resin layer 72. The frame section 41 includes an opening 41a having a size of 15 mm×20 mm, and is bonded to the resin layer 72 by an adhesive that is not illustrated, so that the semiconductor chip 10 is positioned inside the opening 41a in the frame section 41 in the plan view. The frame section 41 may be formed by an insulator, or a conductor such as a metal or the like.

Figure 9A:
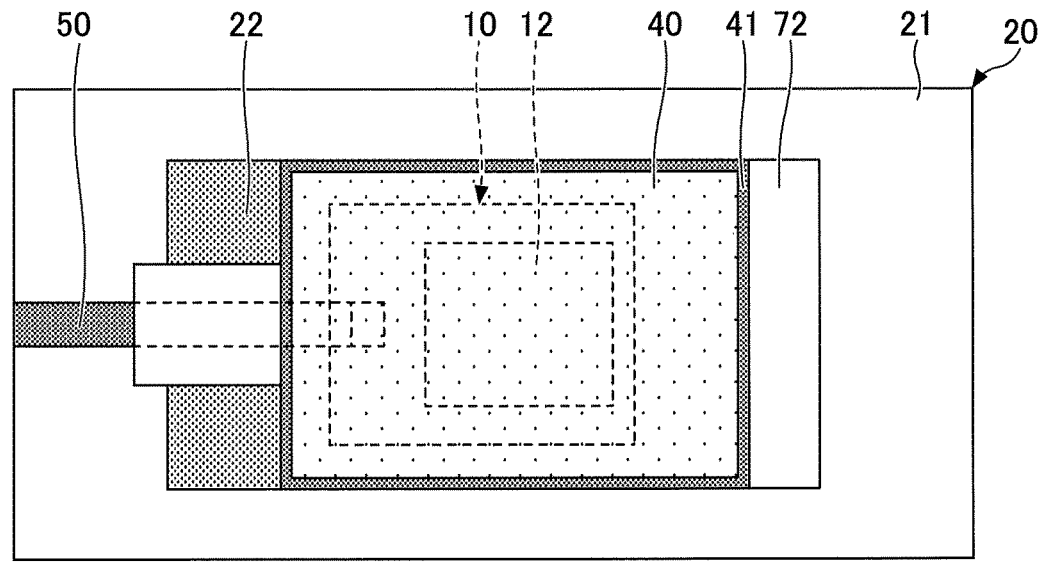
FIG. 9A is a diagram (11) for explaining the processes of the method of manufacturing the semiconductor module according to the first embodiment of the present disclosure.
Figure 9B:
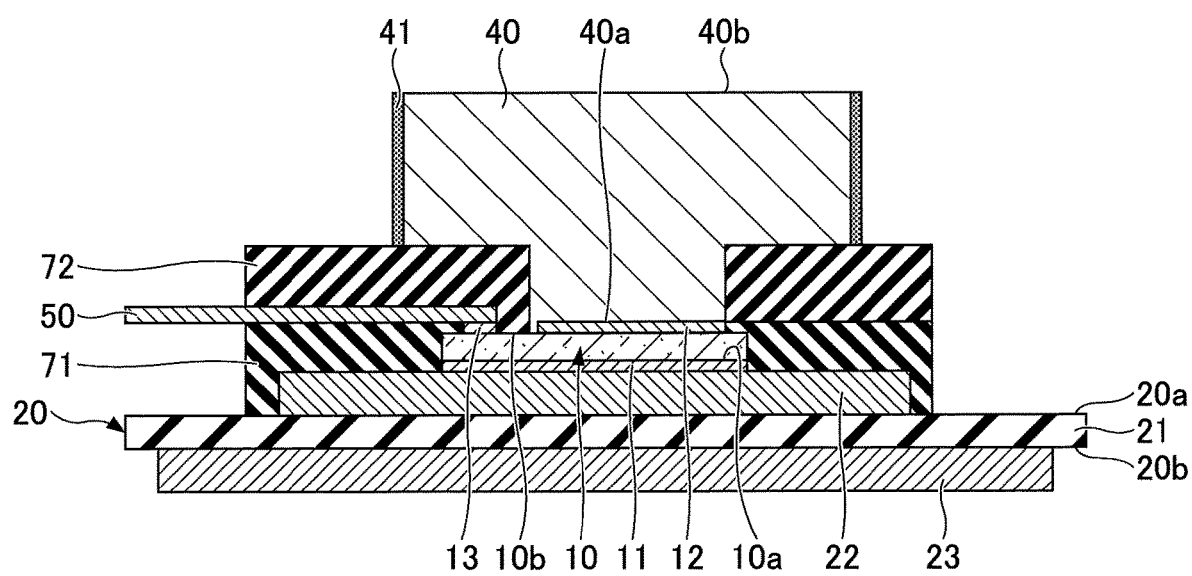
FIG. 9B is a diagram (12) for explaining the processes of the method of manufacturing the semiconductor module according to the first embodiment of the present disclosure.

Next, as illustrated in FIG. 9A and FIG. 9B, the source conductor section 40 is formed inside the opening 41a in the frame section 41. More particularly, a fluid material, such as a silver paste or the like forming the source conductor section 40, is cast inside the opening 41a in the frame section 41 and solidified by sintering, to form the source conductor section 40. Accordingly, the source conductor section 40, that electrically connects to the source electrode pad 12 of the semiconductor chip 10, is formed. The source conductor section 40 that is formed in this manner covers above the semiconductor chip 10, and the source conductor section 40 and the semiconductor chip 10 overlap in the plan view. Hence, in the plan view, the gate electrode pad 13 of the semiconductor chip 10 also overlaps the source conductor section 40. Although the height of the source conductor section 40 that is formed is 10 mm to 20 mm, the low height is advantageous from a viewpoint of heat dissipation. Although the frame section 41 may be removed, the frame section 41 need not be removed when no problems exist from a practical viewpoint.

Figure 10A:
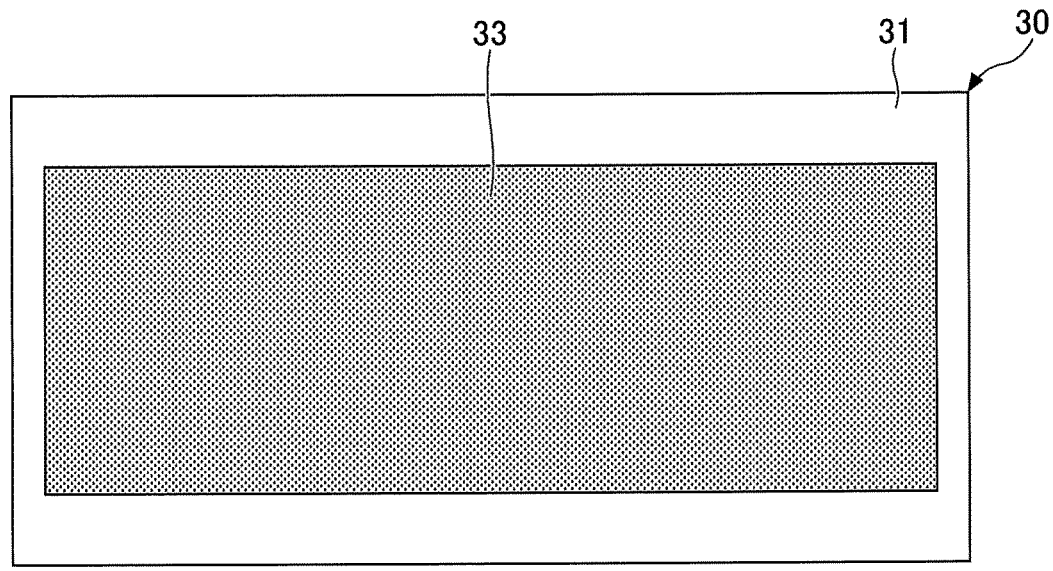
FIG. 10A is a diagram (13) for explaining the processes of the method of manufacturing the semiconductor module according to the first embodiment of the present disclosure.
Figure 10B:
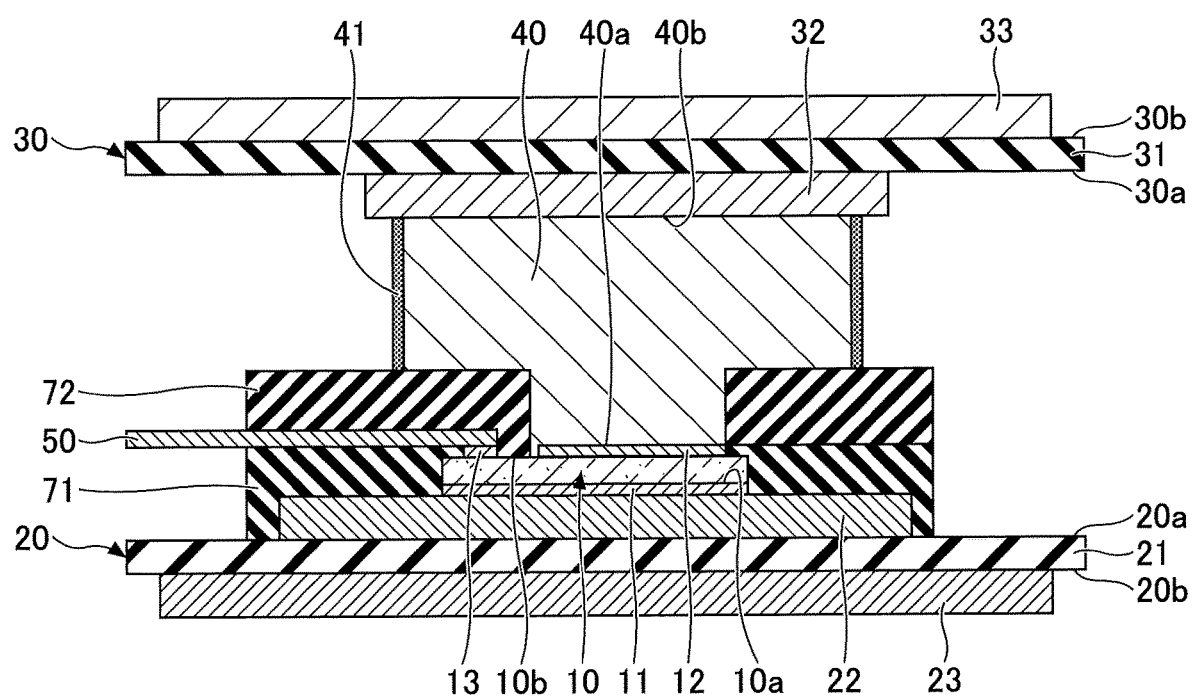
FIG. 10B is a diagram (14) for explaining the processes of the method of manufacturing the semiconductor module according to the first embodiment of the present disclosure.

Next, as illustrated in FIG. 10A and FIG. 10B, the metal layer 32 on the first surface 30a of the second substrate 30 is bonded onto the source conductor section 40 by a solder or the like. Hence, the source conductor section 40 and the metal layer 32 of the second substrate 30 are electrically connected, and the source electrode pad 12 of the semiconductor chip 10 and the metal layer 32 of the second substrate 30 are electrically connected via the source conductor section 40. A bonding temperature in this case is approximately 180° C.

Figure 11A:
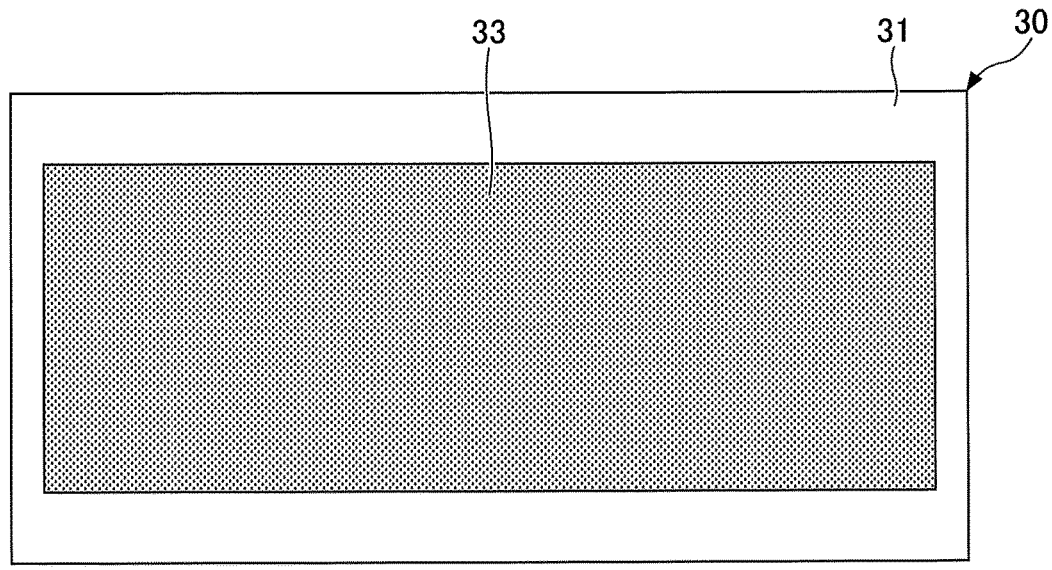
FIG. 11A is a diagram (15) for explaining the processes of the method of manufacturing the semiconductor module according to the first embodiment of the present disclosure.
Figure 11B:
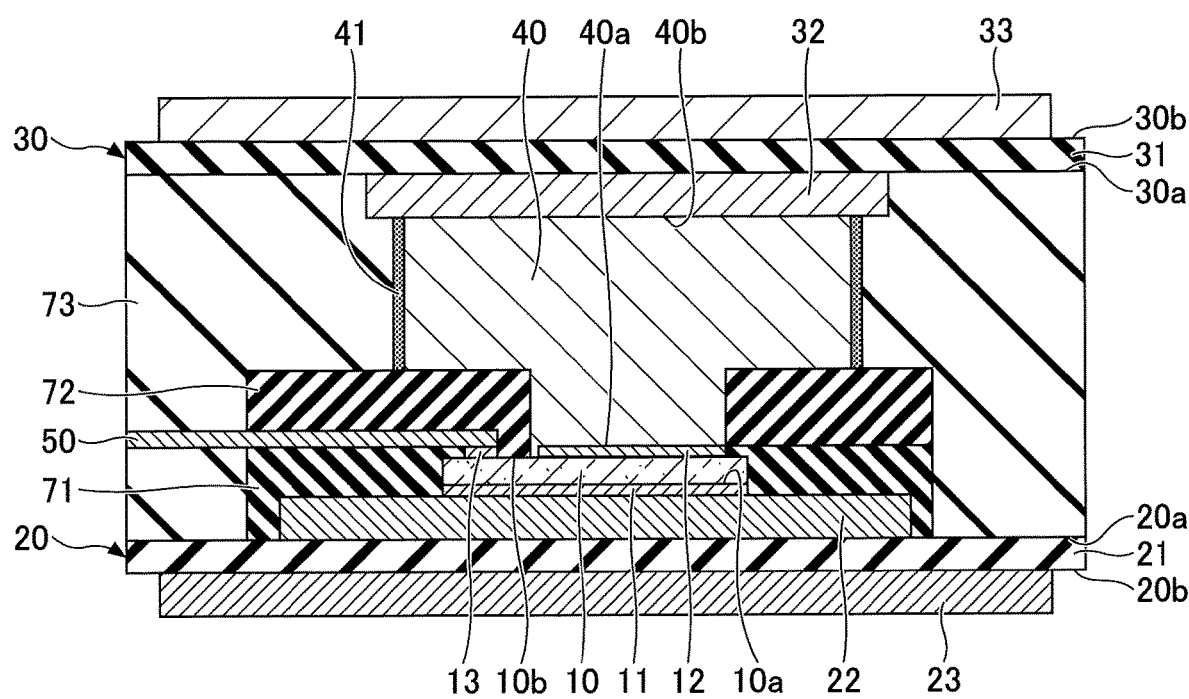
FIG. 11B is a diagram (16) for explaining the processes of the method of manufacturing the semiconductor module according to the first embodiment of the present disclosure.

Next, as illustrated in FIG. 11A and FIG. 11B, a space between the first substrate 20 and the second substrate 30 is filled with the insulating resin section 73. More particularly, a fluid resin material for forming the insulating resin section 73 is cast between the first substrate 20 and the second substrate 30, and cured at a temperature of approximately 140° C. by applying heat, to form the insulating resin section 73. The insulating resin section 73 is formed to fill the space between the first substrate 20 and the second substrate 30, but exposes a portion of the gate electrode terminal 50.

The semiconductor module according to this embodiment can be manufactured by the processes described above.

Second Embodiment

Figure 12:
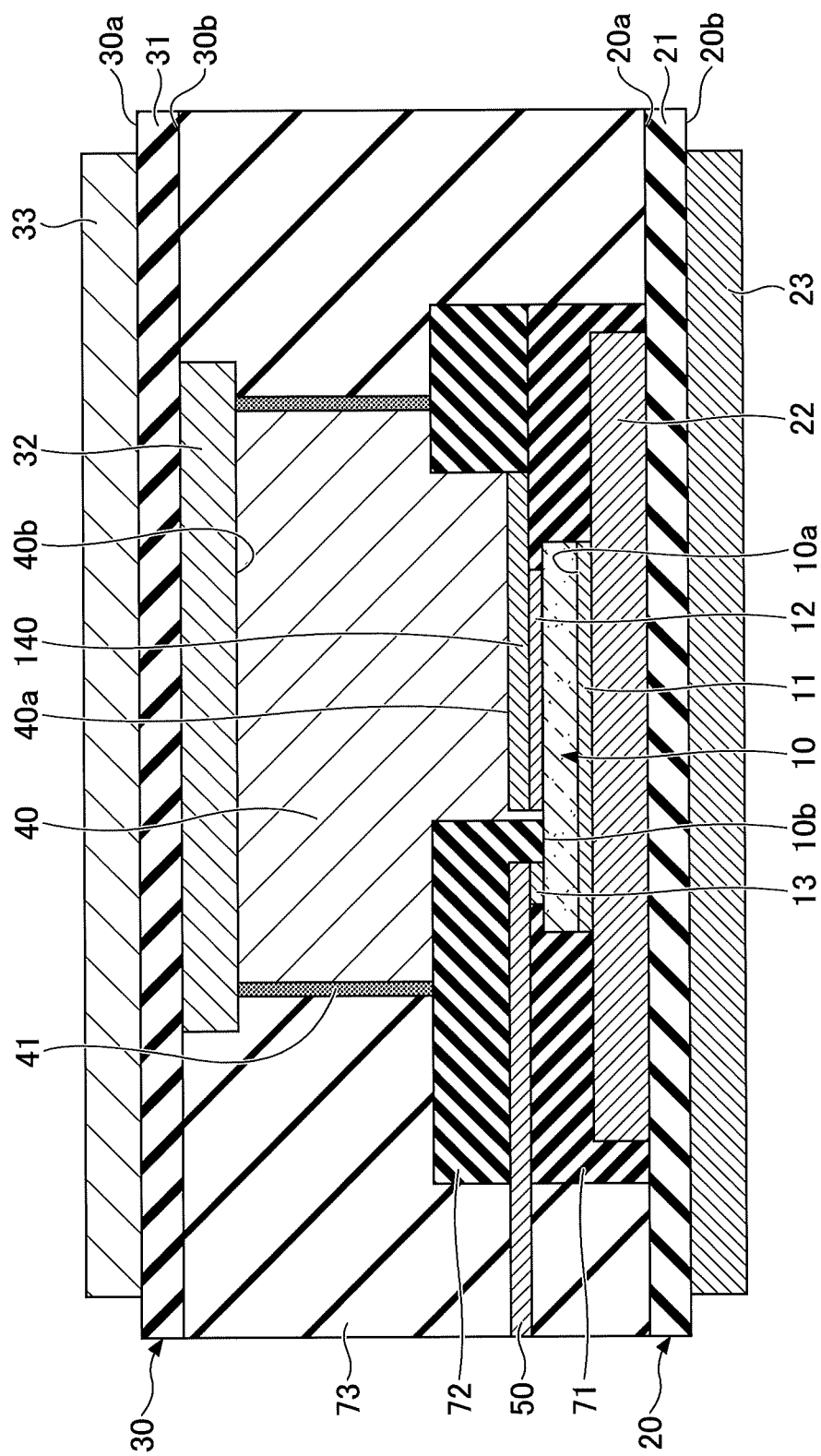
FIG. 12 is a diagram illustrating a structure of the semiconductor module according to a second embodiment of the present disclosure.

Next, the semiconductor module according to a second embodiment will be described, by referring to FIG. 12. The semiconductor module according to this embodiment includes a source metal plate 140 bonded on the source electrode pad 12 of the semiconductor chip 10, and the source conductor section 40 is formed on the source metal plate 140. Accordingly, the source electrode pad 12 and the source metal plate 140 are electrically connected, and the source metal plate 140 and the source conductor section 40 are electrically connected. FIG. 13 illustrates a positional relationships of the semiconductor chip 10, the source metal plate 140, and the source conductor section 40 in the plan view viewed from the side of the second substrate 30. In FIG. 13, the illustration of the second substrate 30, the gate electrode terminal 50, the resin layer 72, or the like is omitted for the sake of convenience. The source metal plate 140 is formed by copper or the like, and is formed to a rectangular shape having a size greater than that of the source electrode pad 12 of the semiconductor chip 10. In this embodiment, the heat dissipation efficiency is improved by the provision of the source metal plate 140.

(Method of Manufacturing Semiconductor Module)

Next, a method of manufacturing the semiconductor module according to this embodiment will be described, by referring to FIG. 14A through FIG. 21B. FIG. 14A through FIG. 21A are top views, and FIG. 14B through FIG. 21B are cross sectional views.

Figure 14A:
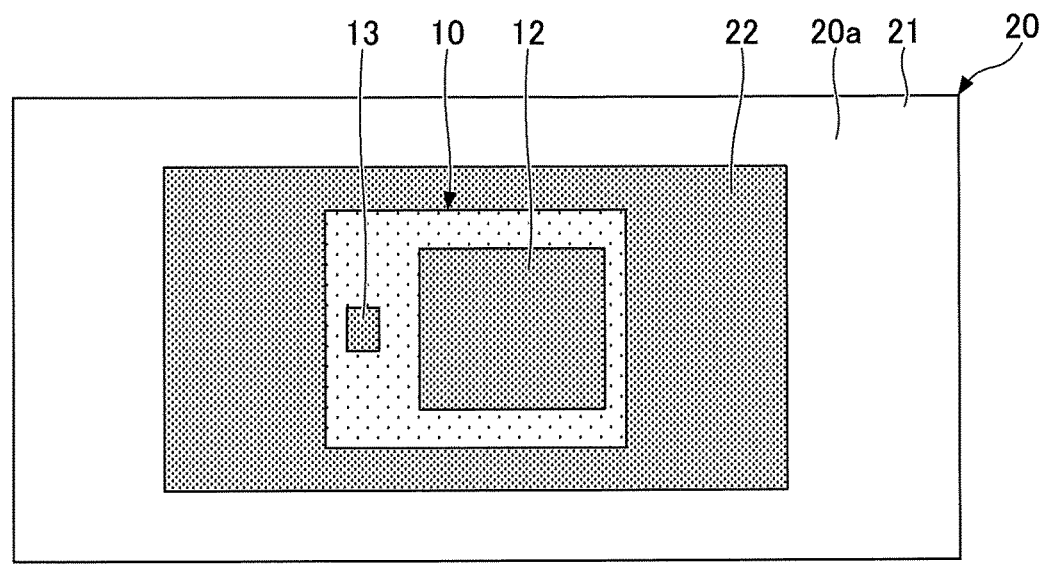
FIG. 14A is a diagram (1) for explaining processes of the method of manufacturing the semiconductor module according to the second embodiment of the present disclosure.
Figure 14B:
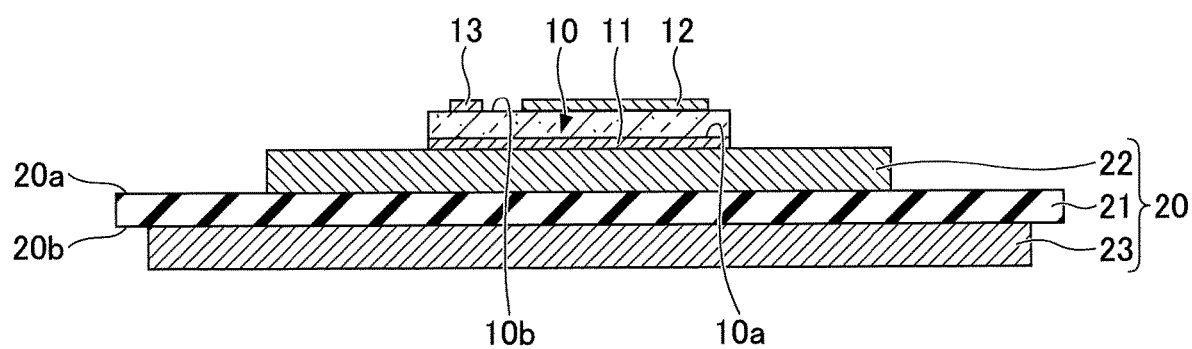
FIG. 14B is a diagram (2) for explaining the processes of the method of manufacturing the semiconductor module according to the second embodiment of the present disclosure.

First, as illustrated in FIG. 14A and FIG. 14B, the drain electrode pad 11, that is formed on the first surface 10a of the semiconductor chip 10, is bonded on the metal layer 22 forming the interconnect layer on the first surface 20a of the first substrate 20, by a solder or the like that is not illustrated.

Figure 15A:
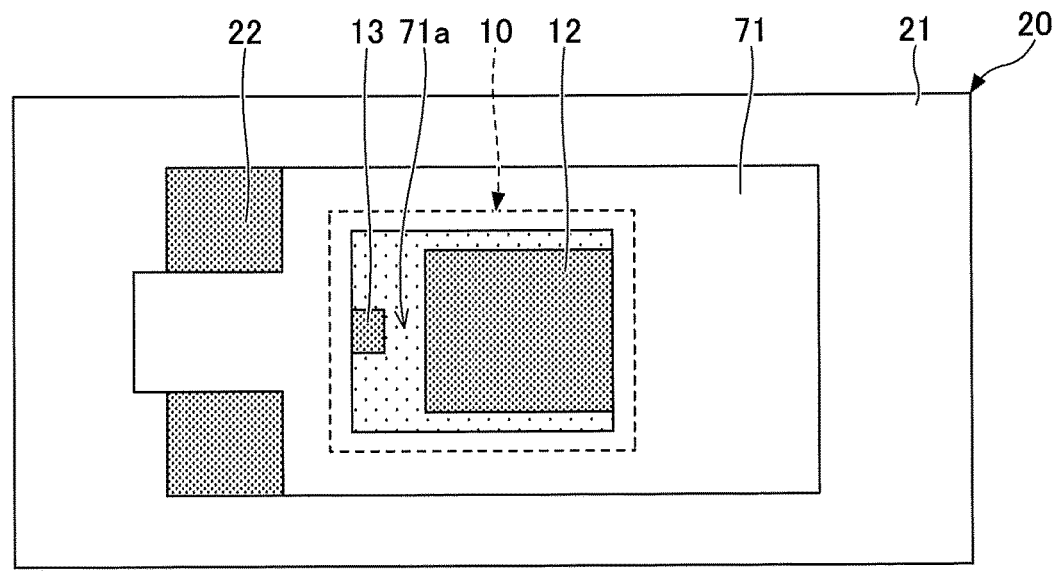
FIG. 15A is a diagram (3) for explaining the processes of the method of manufacturing the semiconductor module according to the second embodiment of the present disclosure.
Figure 15B:
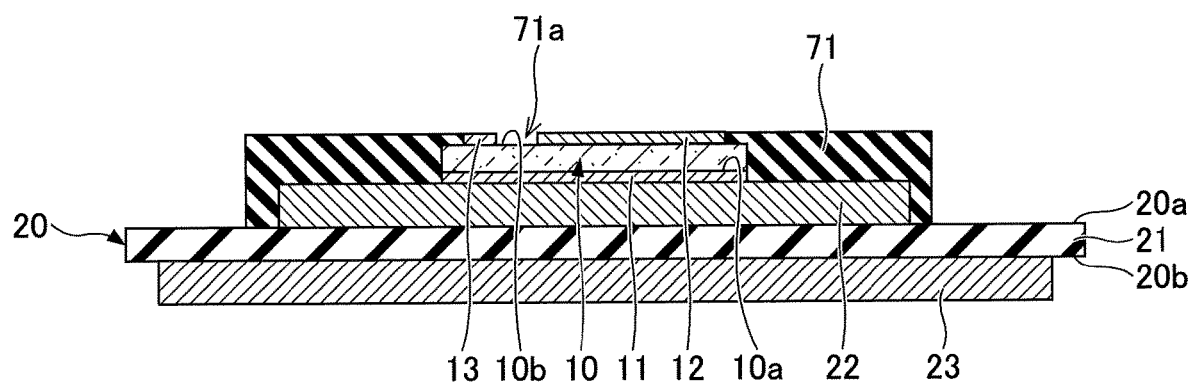
FIG. 15B is a diagram (4) for explaining the processes of the method of manufacturing the semiconductor module according to the second embodiment of the present disclosure.

Next, as illustrated in FIG. 15A and FIG. 15B, the resin layer 71, including the opening 71a, is formed in the region on the second surface 10b of the semiconductor chip 10 where the source electrode pad 12 and the gate electrode pad 13 are formed.

Figure 16A:
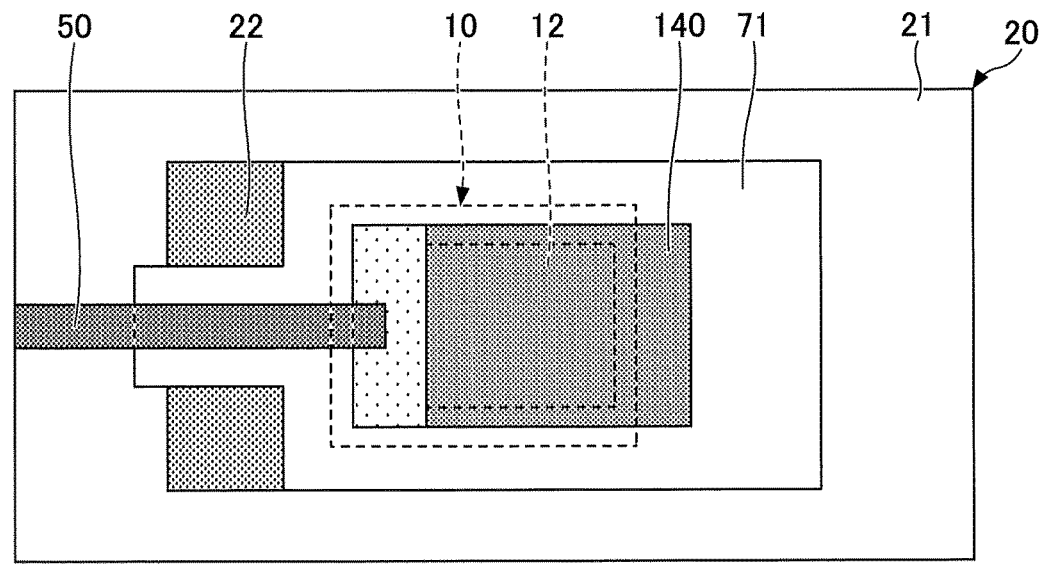
FIG. 16A is a diagram (5) for explaining the processes of the method of manufacturing the semiconductor module according to the second embodiment of the present disclosure.
Figure 16B:
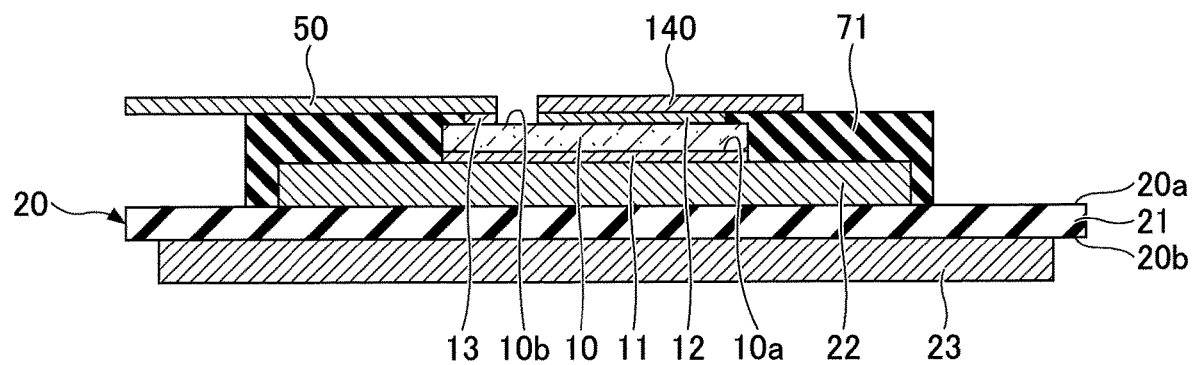
FIG. 16B is a diagram (6) for explaining the processes of the method of manufacturing the semiconductor module according to the second embodiment of the present disclosure.

Next, as illustrated in FIG. 16A and FIG. 16B, the gate electrode terminal 50 is bonded to the gate electrode pad 13 by a solder or the like, and the source metal plate 140 is bonded to the source electrode pad 12 by a solder or the like.

Figure 17A:
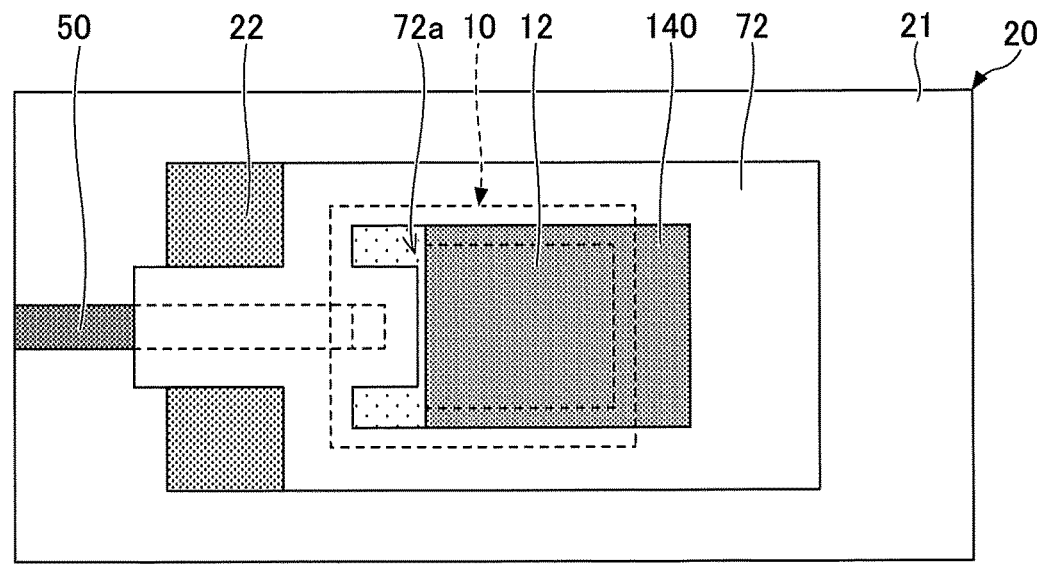
FIG. 17A is a diagram (7) for explaining the processes of the method of manufacturing the semiconductor module according to the second embodiment of the present disclosure.
Figure 17B:
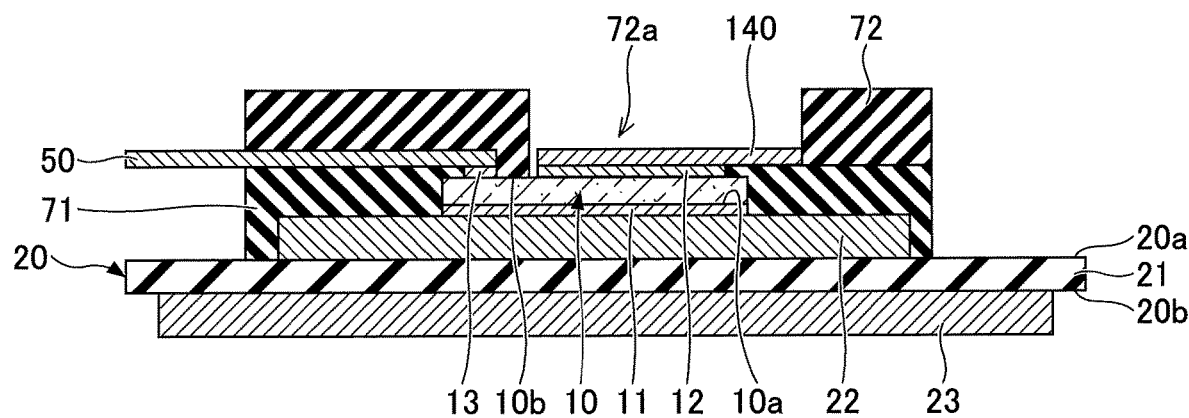
FIG. 17B is a diagram (8) for explaining the processes of the method of manufacturing the semiconductor module according to the second embodiment of the present disclosure.

Next, as illustrated in FIG. 17A and FIG. 17B, the resin layer 72 is formed on the resin layer 71, and the gate electrode terminal 50 on the resin layer 71.

Figure 18A:
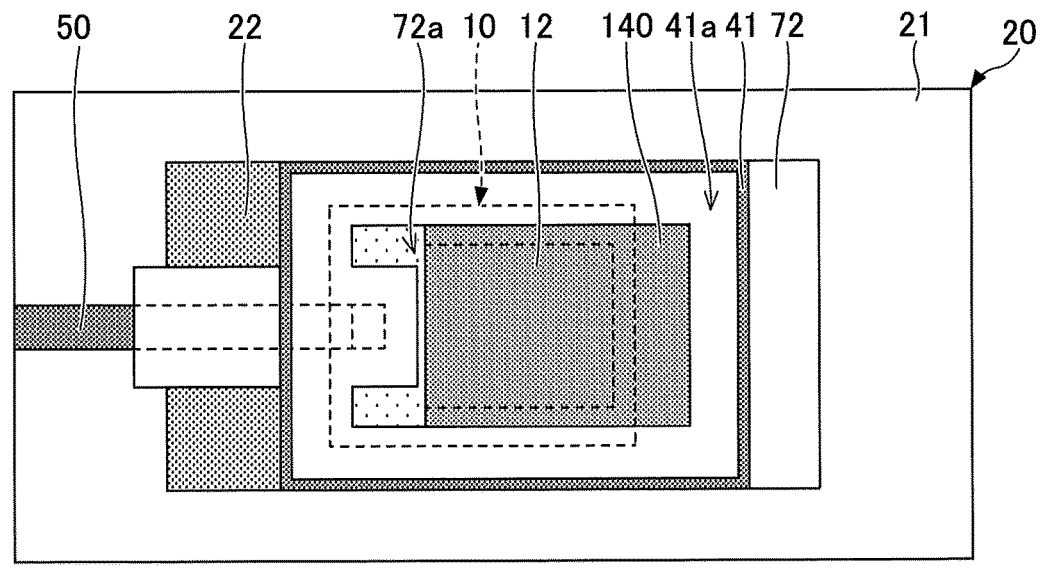
FIG. 18A is a diagram (9) for explaining the processes of the method of manufacturing the semiconductor module according to the second embodiment of the present disclosure.
Figure 18B:
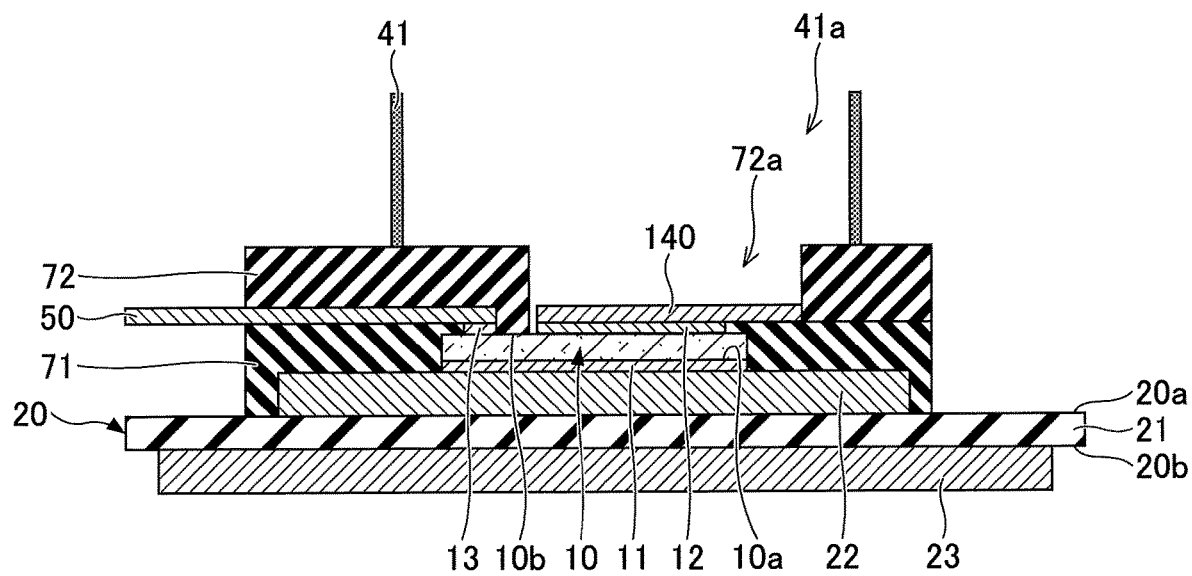
FIG. 18B is a diagram (10) for explaining the processes of the method of manufacturing the semiconductor module according to the second embodiment of the present disclosure.

Next, as illustrated in FIG. 18A and FIG. 18B, the frame section 41, including the opening 41a, is bonded onto the resin layer 72.

Figure 19A:
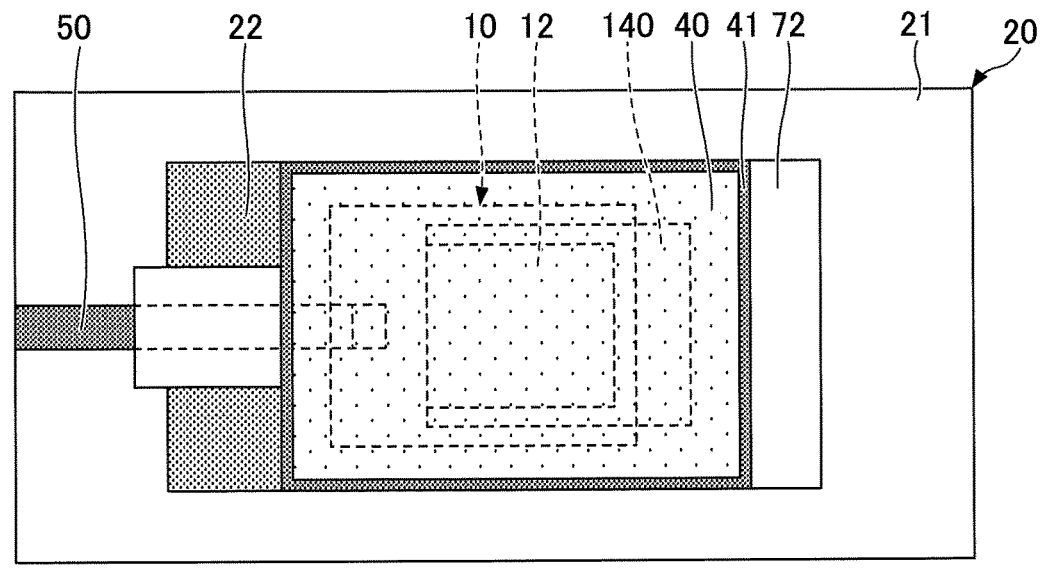
FIG. 19A is a diagram (11) for explaining the processes of the method of manufacturing the semiconductor module according to the second embodiment of the present disclosure.
Figure 19B:
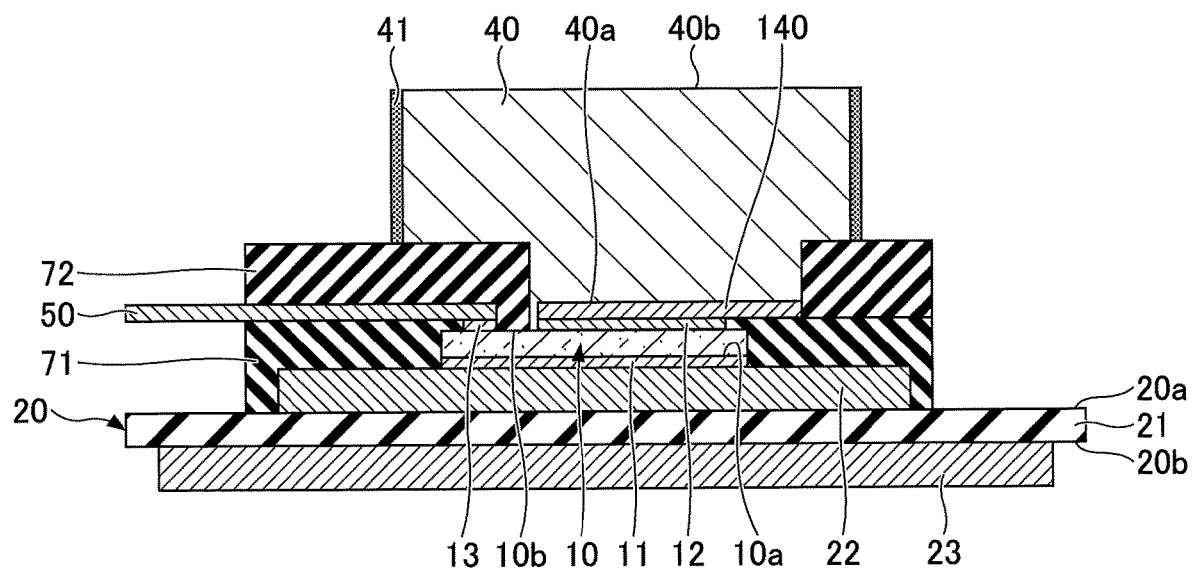
FIG. 19B is a diagram (12) for explaining the processes of the method of manufacturing the semiconductor module according to the second embodiment of the present disclosure.

Next, as illustrated in FIG. 19A and FIG. 19B, the source conductor section 40 is formed inside the opening 41a in the frame section 41. Hence, the source conductor section 40 is formed on the source metal plate 140.

Figure 20A:
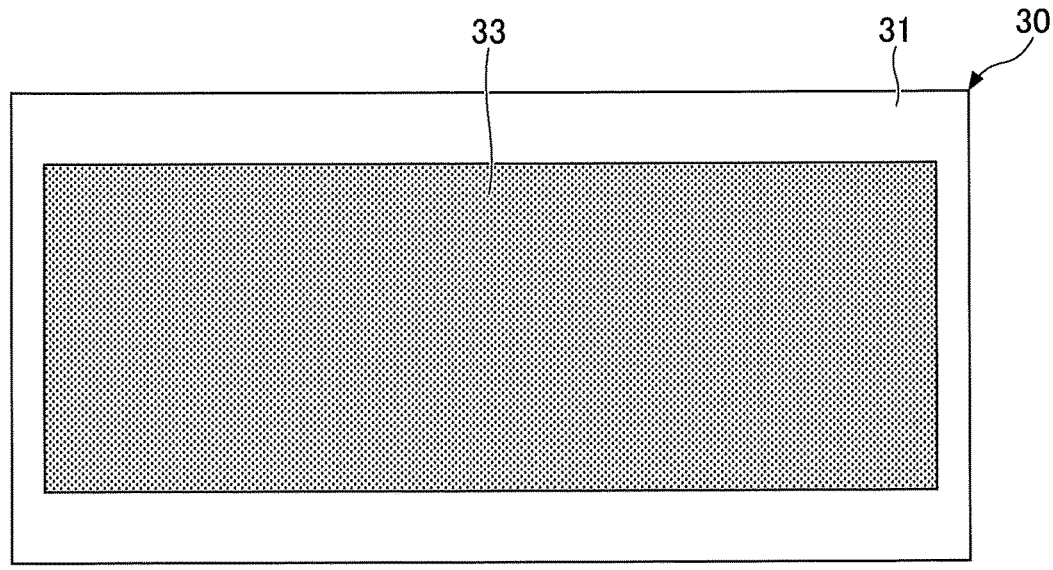
FIG. 20A is a diagram (13) for explaining the processes of the method of manufacturing the semiconductor module according to the second embodiment of the present disclosure.
Figure 20B:
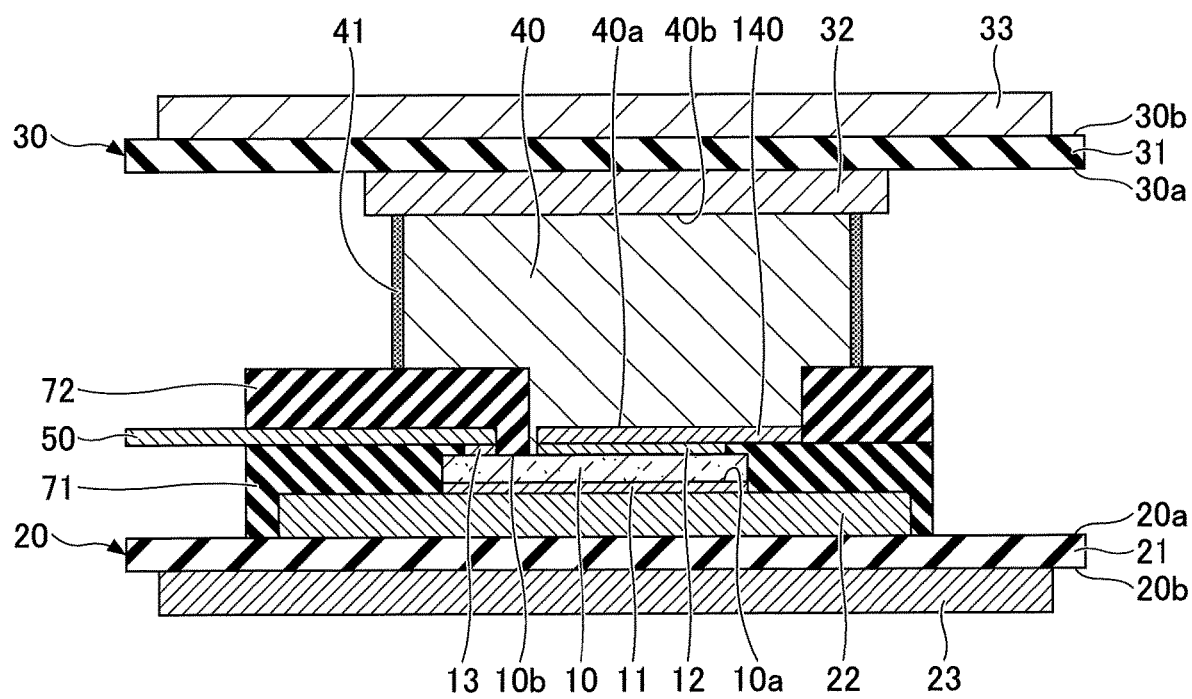
FIG. 20B is a diagram (14) for explaining the processes of the method of manufacturing the semiconductor module according to the second embodiment of the present disclosure.

Next, as illustrated in FIG. 20A and FIG. 20B, the metal layer 32 on the first surface 30a of the second substrate 30 is bonded onto the source conductor section 40 by a solder or the like.

Figure 21A:
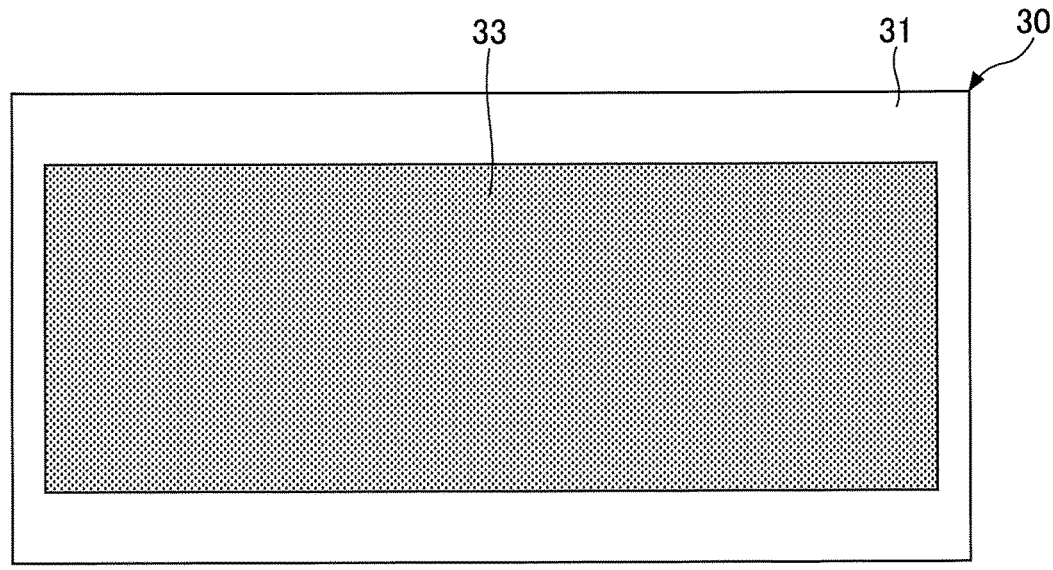
FIG. 21A is a diagram (15) for explaining the processes of the method of manufacturing the semiconductor module according to the second embodiment of the present disclosure.
Figure 21B:
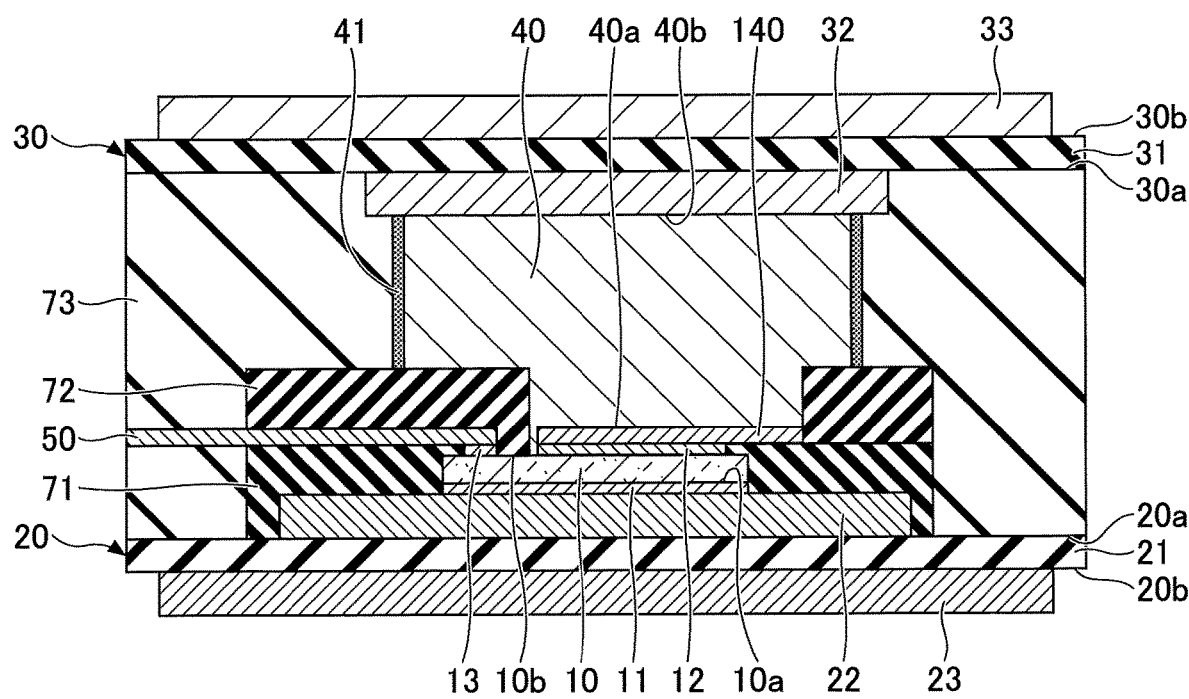
FIG. 21B is a diagram (16) for explaining the processes of the method of manufacturing the semiconductor module according to the second embodiment of the present disclosure.

Next, as illustrated in FIG. 21A and FIG. 21B, the space between the first substrate 20 and the second substrate 30 is filled with the insulating resin section 73.

The semiconductor module according to this embodiment can be manufactured by the processes described above.

Unless otherwise indicated, the features of this embodiment are the same as those of the first embodiment.

Third Embodiment

Figure 22:
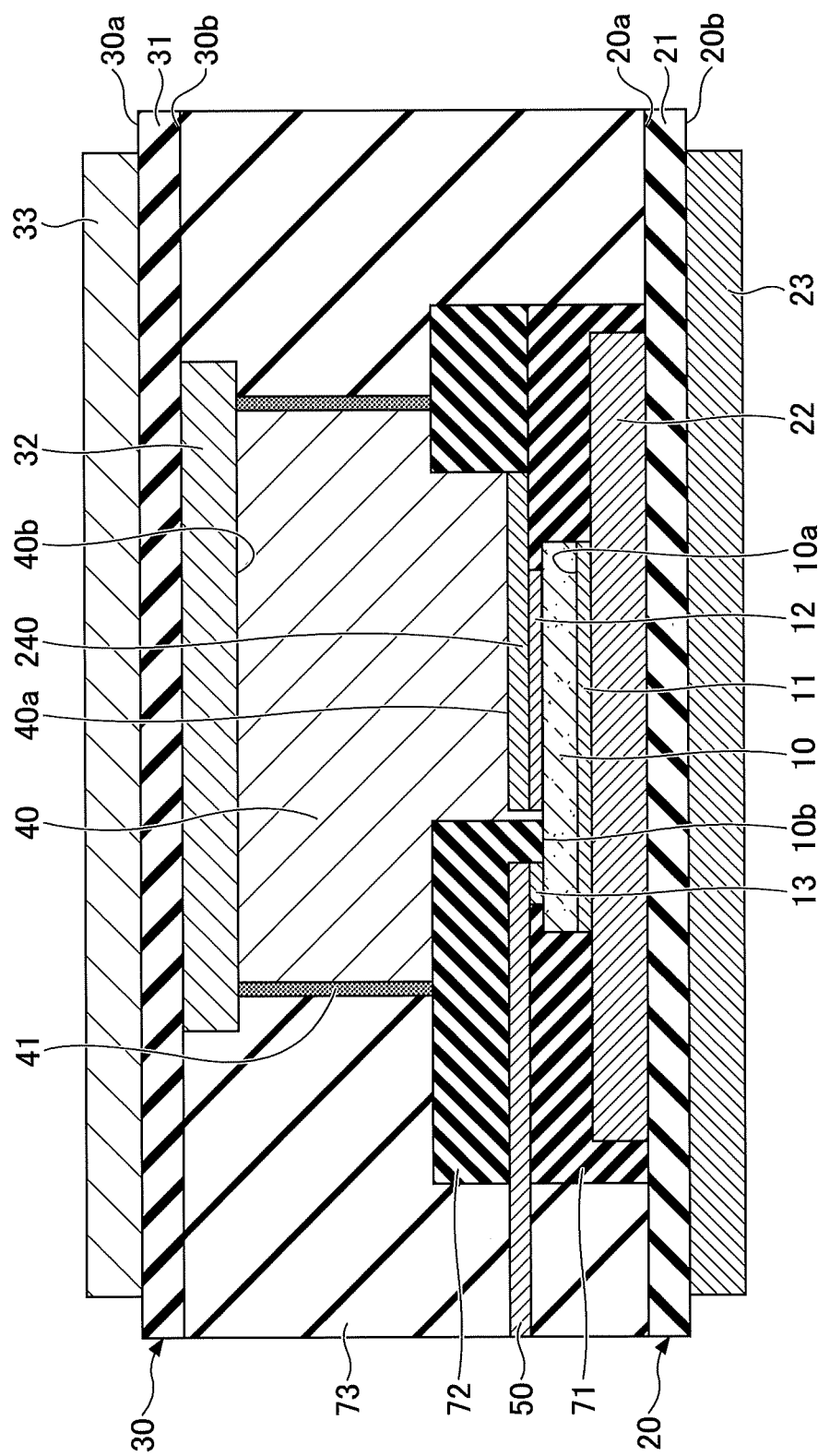
FIG. 22 is a diagram illustrating a structure of the semiconductor module according to a third embodiment of the present disclosure.

Next, the semiconductor module according to a third embodiment will be described, by referring to FIG. 22. The semiconductor module according to this embodiment includes a source auxiliary terminal 240 bonded on the source electrode pad 12 of the semiconductor chip 10, and the source conductor section 40 is formed on the source auxiliary terminal 240. Accordingly, the source electrode pad 12 and the source auxiliary terminal 240 are electrically connected, and the source auxiliary terminal 240 and the source conductor section 40 are electrically connected. In this application, the source auxiliary terminal 240 may be referred to as a second electrode terminal.

Figure 23:
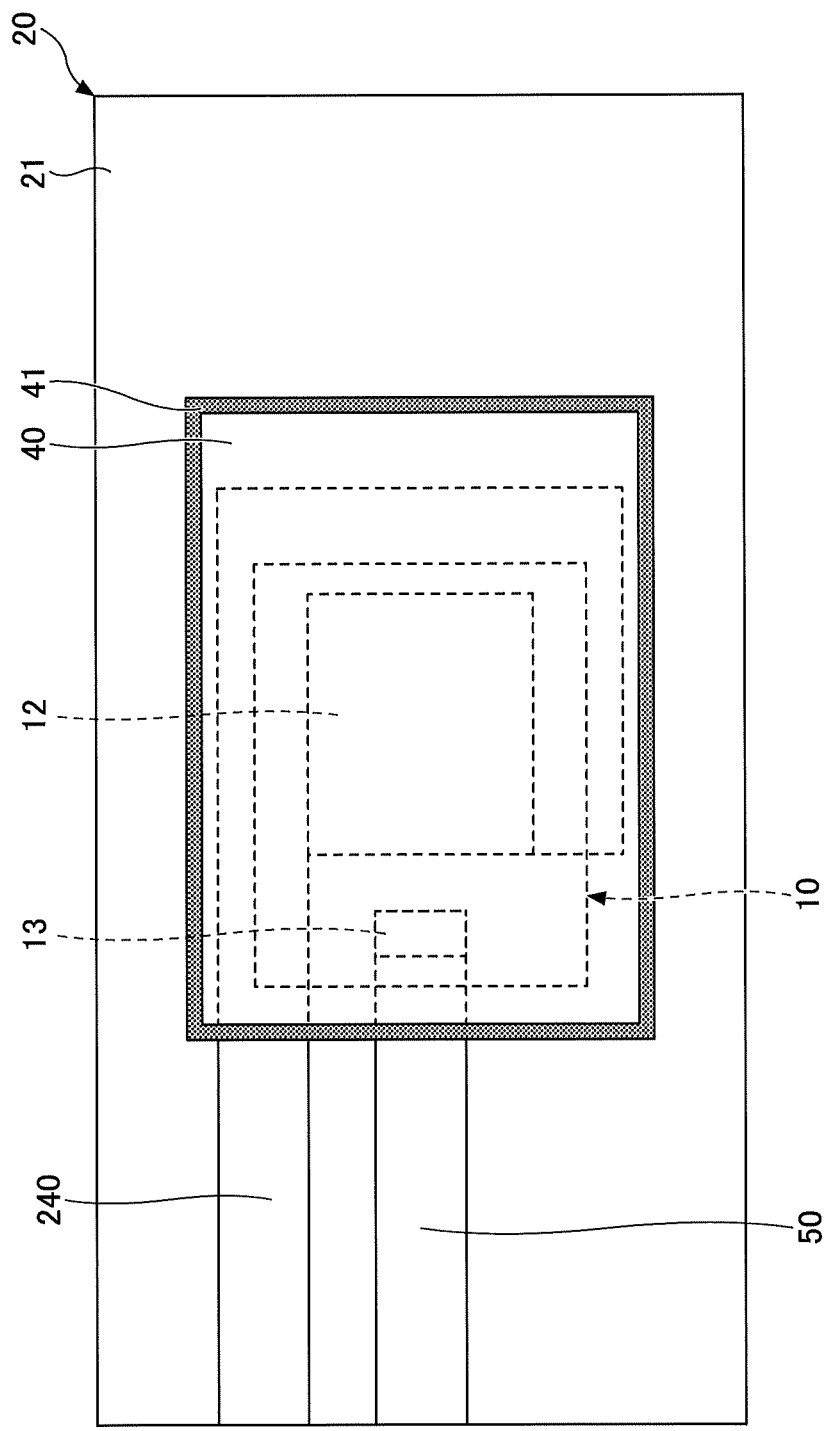
FIG. 23 is a diagram for explaining the semiconductor module according to the third embodiment of the present disclosure.

FIG. 23 illustrates positional relationships of the semiconductor chip 10, the gate electrode terminal 50, the source auxiliary terminal 240, and the source conductor section 40, in the plan view viewed from the side of the second substrate 30. In FIG. 23, the illustration of the second substrate 30, the resin layer 72, or the like is omitted for the sake of convenience. The source auxiliary terminal 240 is formed by copper or the like, and is formed to a shape that is greater than that of the source electrode pad 12 of the semiconductor chip 10. The source auxiliary terminal 240 is provided separately from the source electrode, and is provided to apply a stable gate voltage in the semiconductor chip 10 in which a large current flows. Similar to the gate electrode terminal 50, the source auxiliary terminal 240 is arranged between the first substrate 20 and the second substrate 30, parallel to the first substrate 20 and the second substrate 30, and a portion of the end part of the source auxiliary terminal 240 is exposed from the insulating resin section 73. In this embodiment, it is possible to improve the heat dissipation efficiency and stabilize the semiconductor module, by the provision of the source auxiliary terminal 240.

(Method of Manufacturing Semiconductor Module)

Next, a method of manufacturing the semiconductor module according to this embodiment will be described, by referring to FIG. 24A through FIG. 31B. FIG. 24A through FIG. 31A are top views, and FIG. 24B through FIG. 31B are cross sectional views.

Figure 24A:
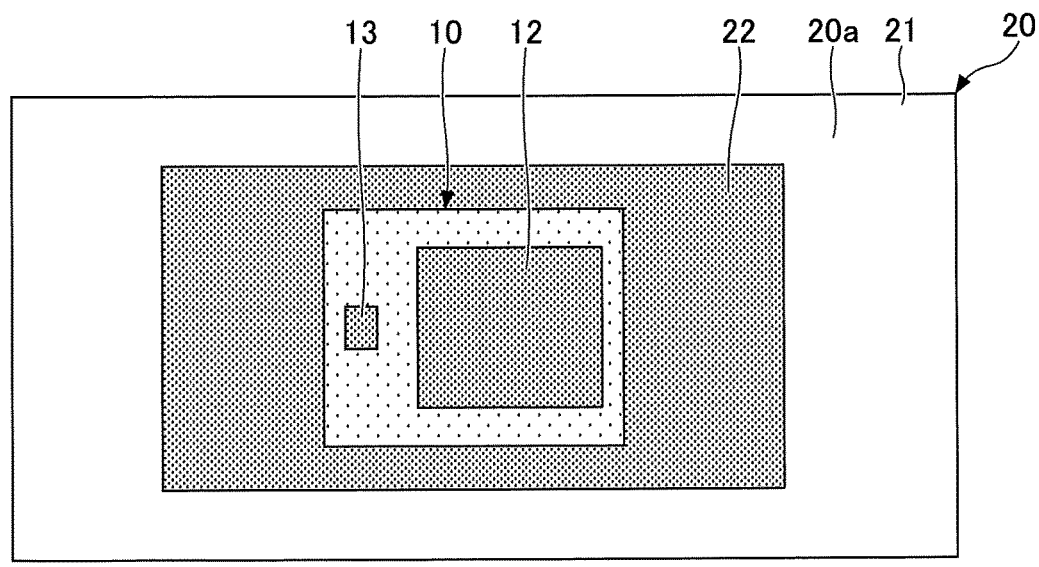
FIG. 24A is a diagram (1) for explaining processes of the method of manufacturing the semiconductor module according to the third embodiment of the present disclosure.
Figure 24B:
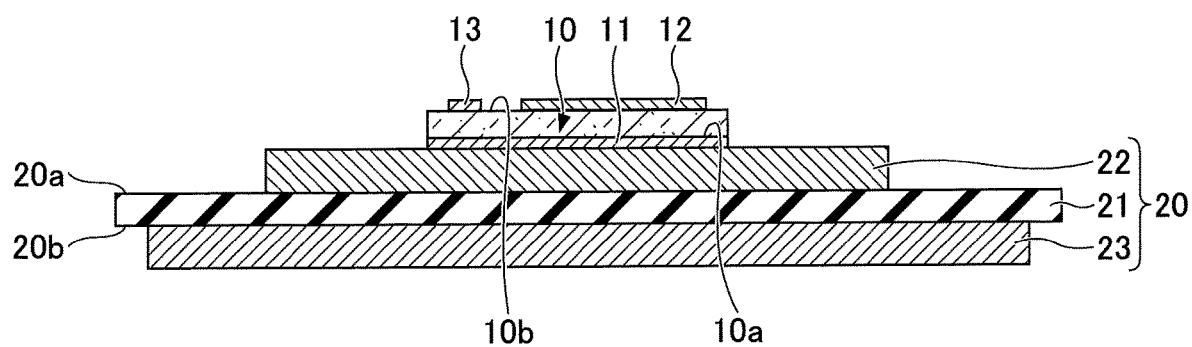
FIG. 24B is a diagram (2) for explaining the processes of the method of manufacturing the semiconductor module according to the third embodiment of the present disclosure.

First, as illustrated in FIG. 24A and FIG. 24B, the drain electrode pad 11, that is formed on the first surface 10a of the semiconductor chip 10, is bonded on the metal layer 22 forming the interconnect layer on the first surface 20a of the first substrate 20, by a solder or the like that is not illustrated.

Figure 25A:
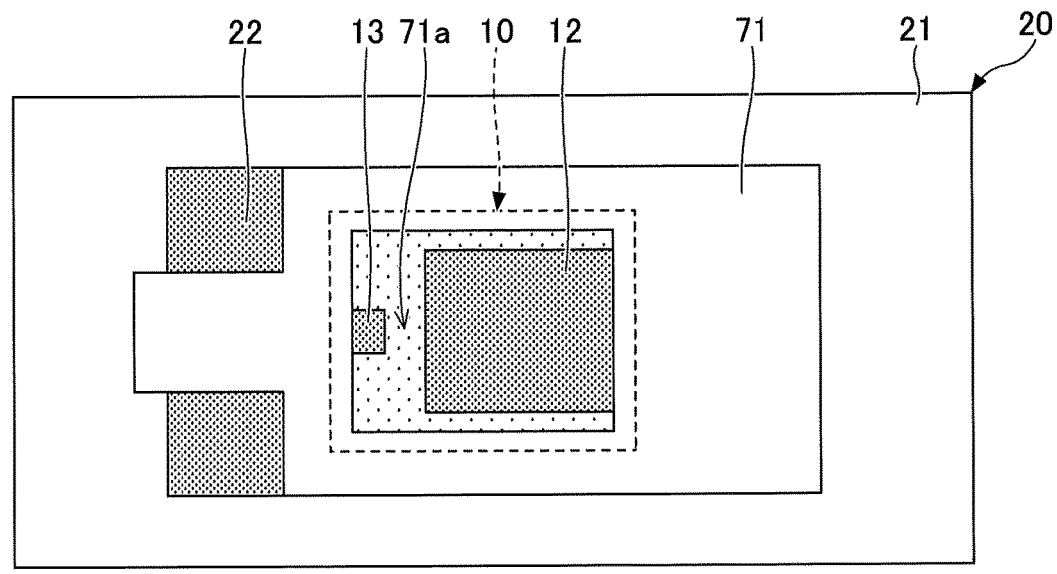
FIG. 25A is a diagram (3) for explaining the processes of the method of manufacturing the semiconductor module according to the third embodiment of the present disclosure.
Figure 25B:
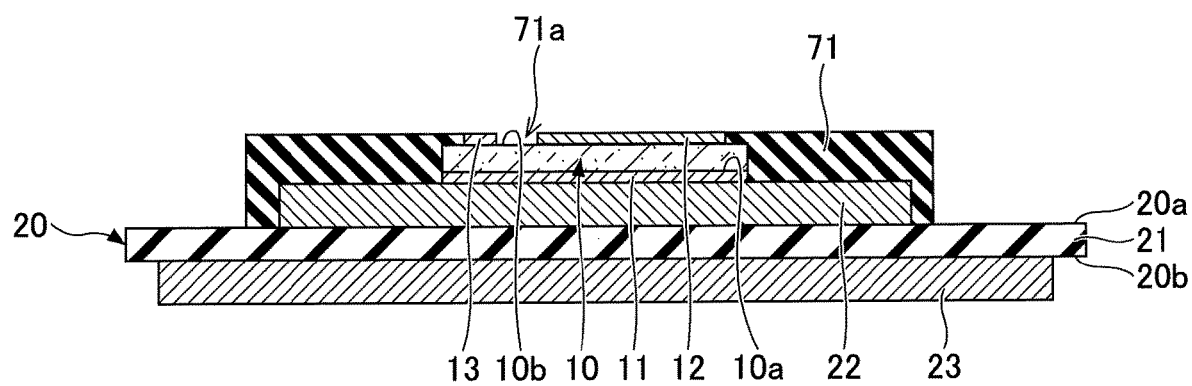
FIG. 25B is a diagram (4) for explaining the processes of the method of manufacturing the semiconductor module according to the third embodiment of the present disclosure.

Next, as illustrated in FIG. 25A and FIG. 25B, the resin layer 71, including the opening 71a, is formed in the region on the second surface 10b of the semiconductor chip 10 where the source electrode pad 12 and the gate electrode pad 13 are formed.

Figure 26A:
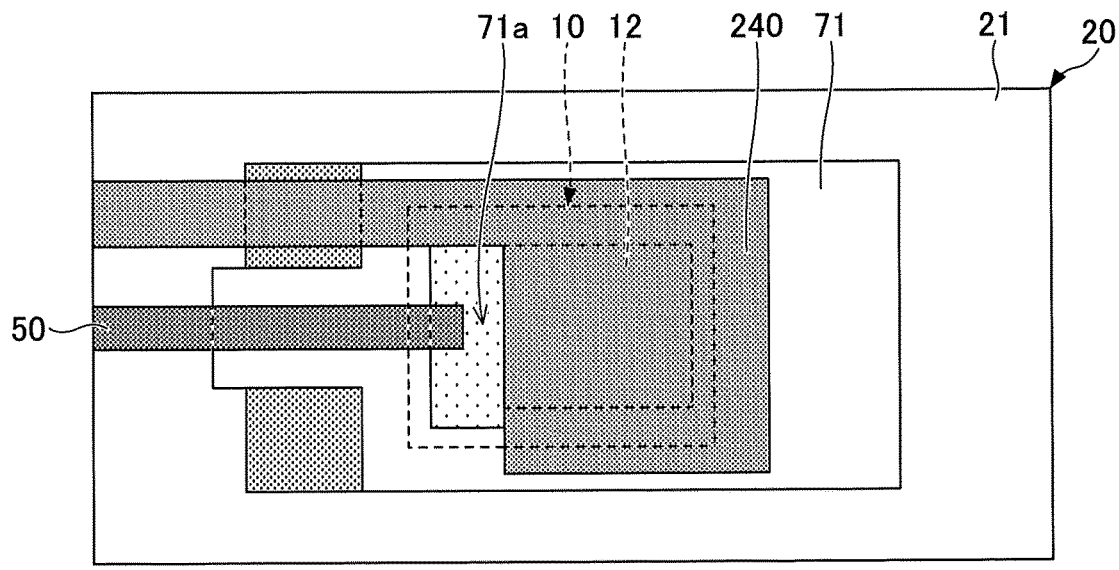
FIG. 26A is a diagram (5) for explaining the processes of the method of manufacturing the semiconductor module according to the third embodiment of the present disclosure.
Figure 26B:
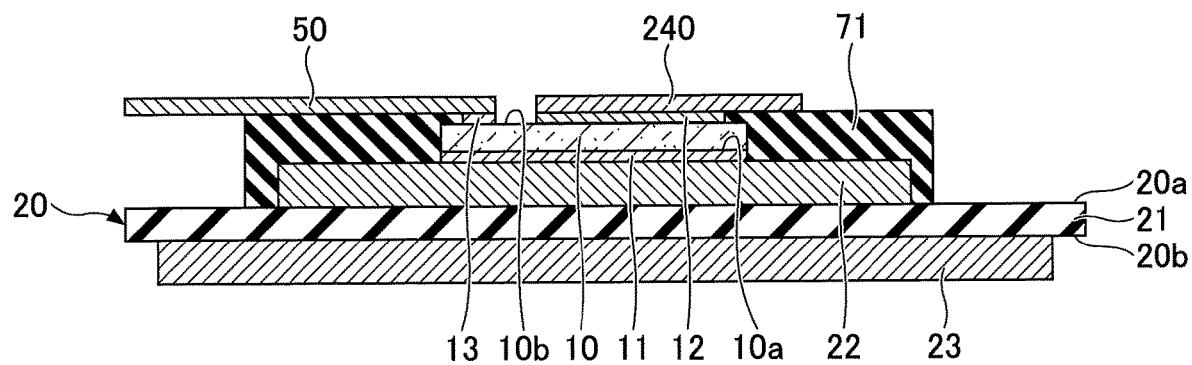
FIG. 26B is a diagram (6) for explaining the processes of the method of manufacturing the semiconductor module according to the third embodiment of the present disclosure.

Next, as illustrated in FIG. 26A and FIG. 26B, the gate electrode terminal 50 is bonded to the gate electrode pad 13 by a solder or the like, and the source auxiliary terminal 240 is bonded to the source electrode pad 12 by a solder or the like.

Figure 27A:
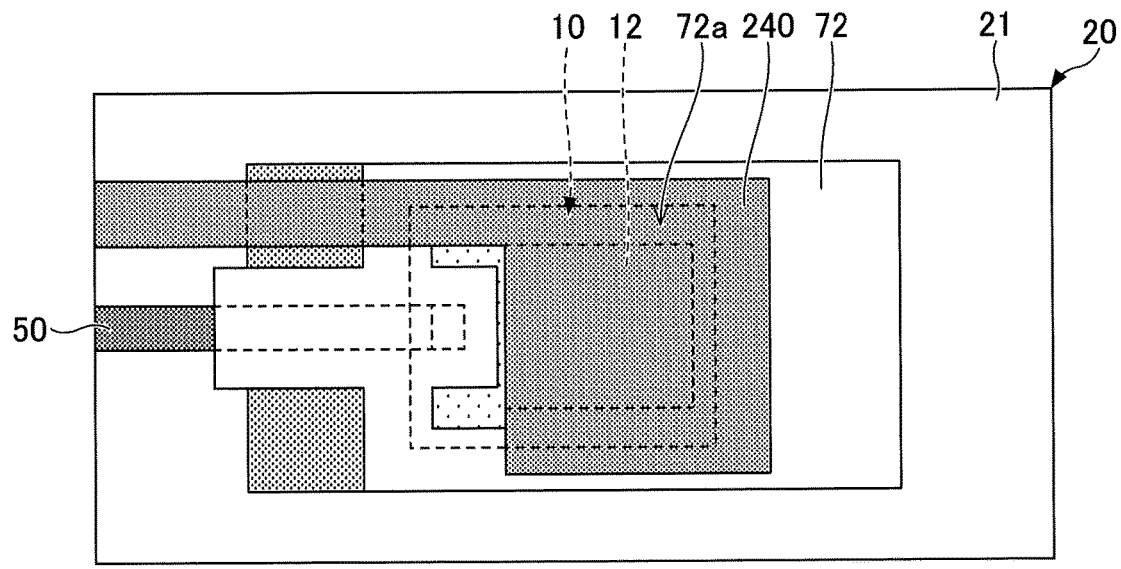
FIG. 27A is a diagram (7) for explaining the processes of the method of manufacturing the semiconductor module according to the third embodiment of the present disclosure.
Figure 27B:
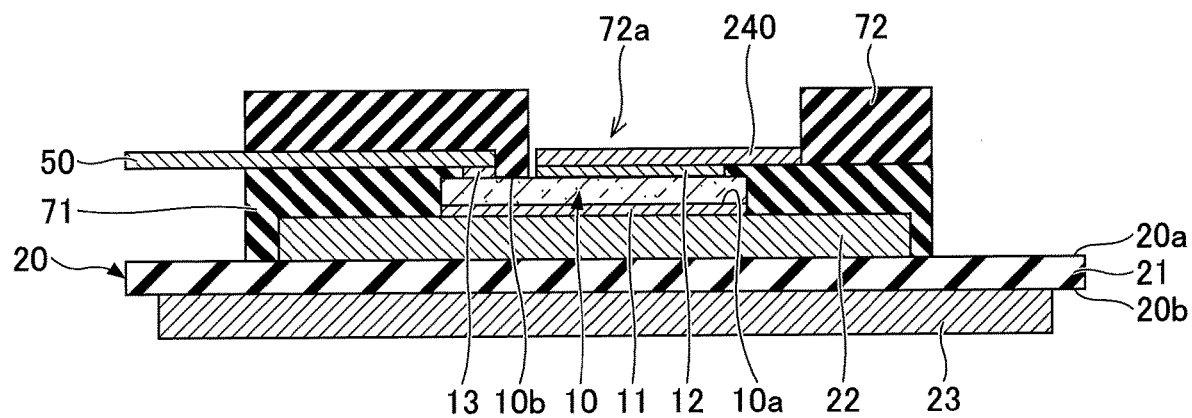
FIG. 27B is a diagram (8) for explaining the processes of the method of manufacturing the semiconductor module according to the third embodiment of the present disclosure.

Next, as illustrated in FIG. 27A and FIG. 27B, the resin layer 72 is formed on the resin layer 71, and the gate electrode terminal 50 on the resin layer 71.

Figure 28A:
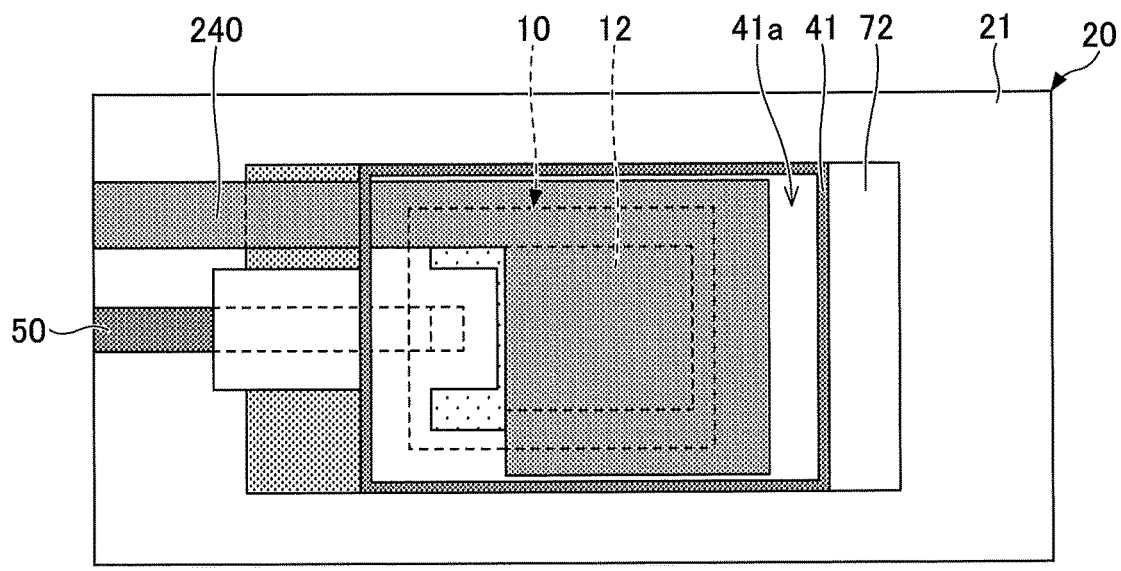
FIG. 28A is a diagram (9) for explaining the processes of the method of manufacturing the semiconductor module according to the third embodiment of the present disclosure.
Figure 28B:
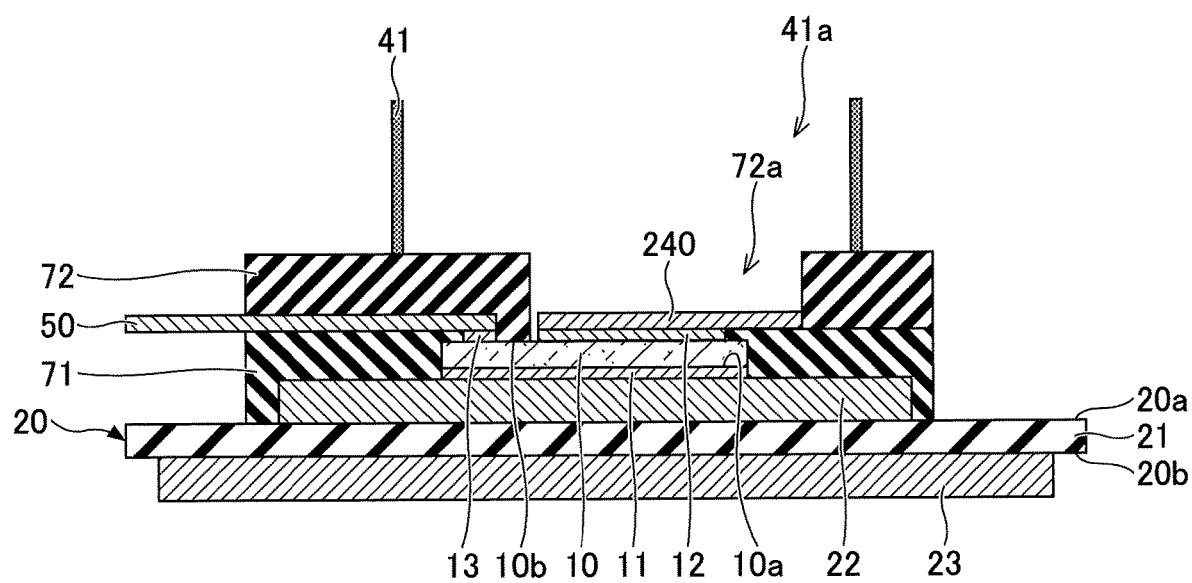
FIG. 28B is a diagram (10) for explaining the processes of the method of manufacturing the semiconductor module according to the third embodiment of the present disclosure.

Next, as illustrated in FIG. 28A and FIG. 28B, the frame section 41, including the opening 41a, is bonded onto the resin layer 72.

Figure 29A:
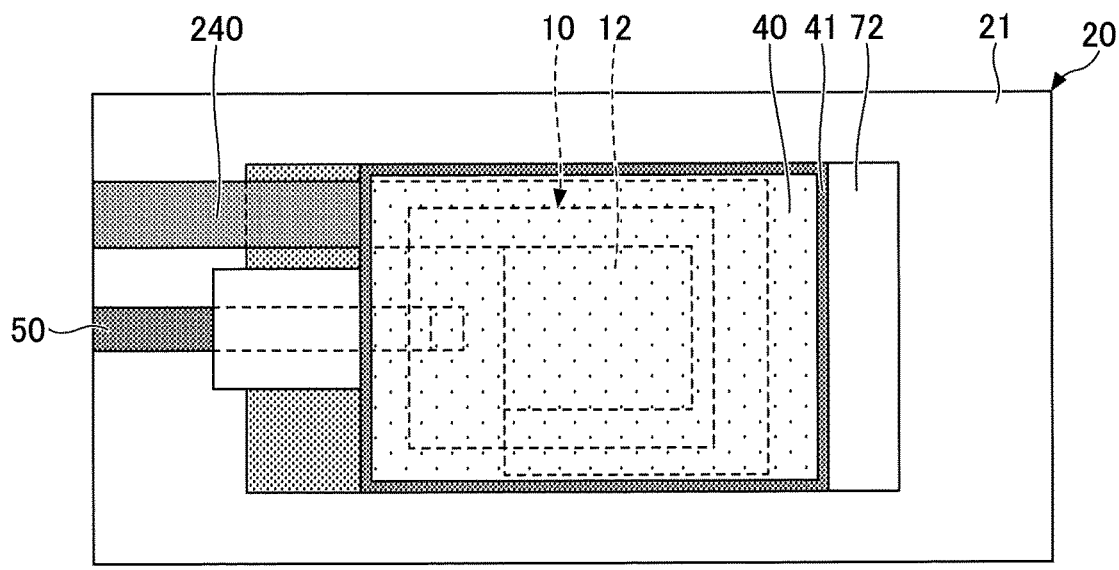
FIG. 29A is a diagram (11) for explaining the processes of the method of manufacturing the semiconductor module according to the third embodiment of the present disclosure.
Figure 29B:
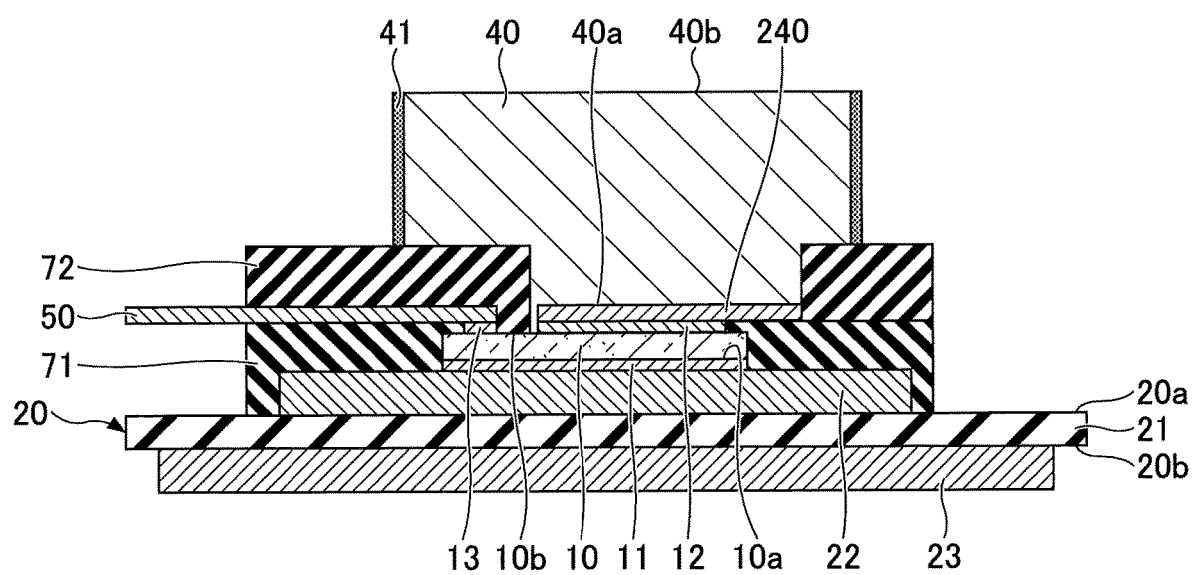
FIG. 29B is a diagram (12) for explaining the processes of the method of manufacturing the semiconductor module according to the third embodiment of the present disclosure.

Next, as illustrated in FIG. 29A and FIG. 29B, the source conductor section 40 is formed inside the opening 41a in the frame section 41. Hence, the source conductor section 40 is formed on the source metal plate 140.

Figure 30A:
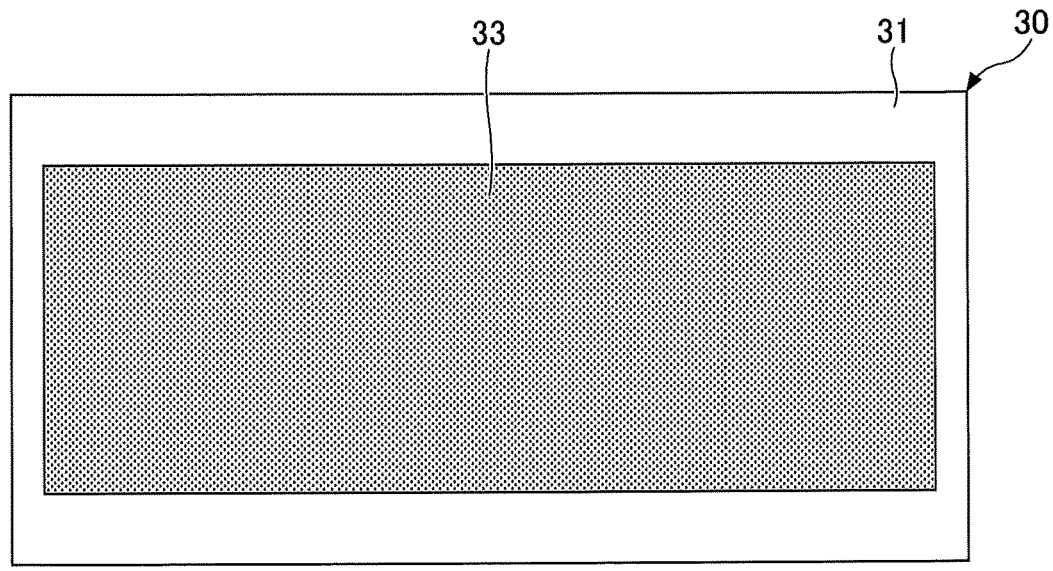
FIG. 30A is a diagram (13) for explaining the processes of the method of manufacturing the semiconductor module according to the third embodiment of the present disclosure.
Figure 30B:
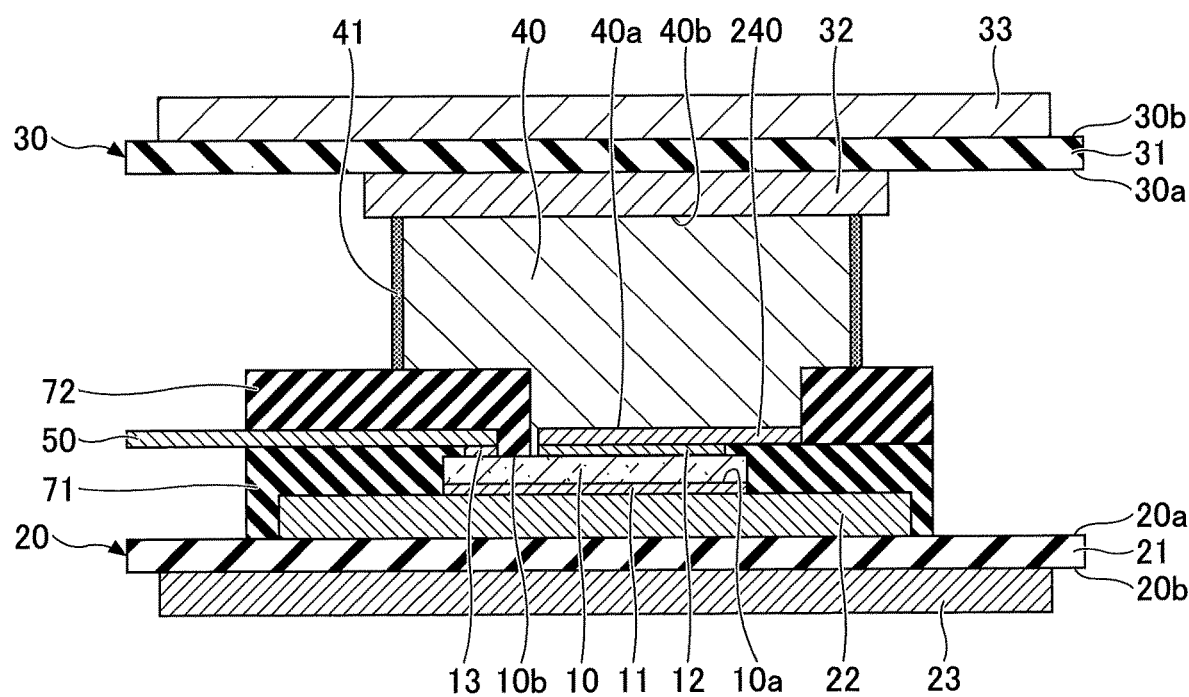
FIG. 30B is a diagram (14) for explaining the processes of the method of manufacturing the semiconductor module according to the third embodiment of the present disclosure.

Next, as illustrated in FIG. 30A and FIG. 30B, the metal layer 32 on the first surface 30a of the second substrate 30 is bonded onto the source conductor section 40 by a solder or the like.

Figure 31A:
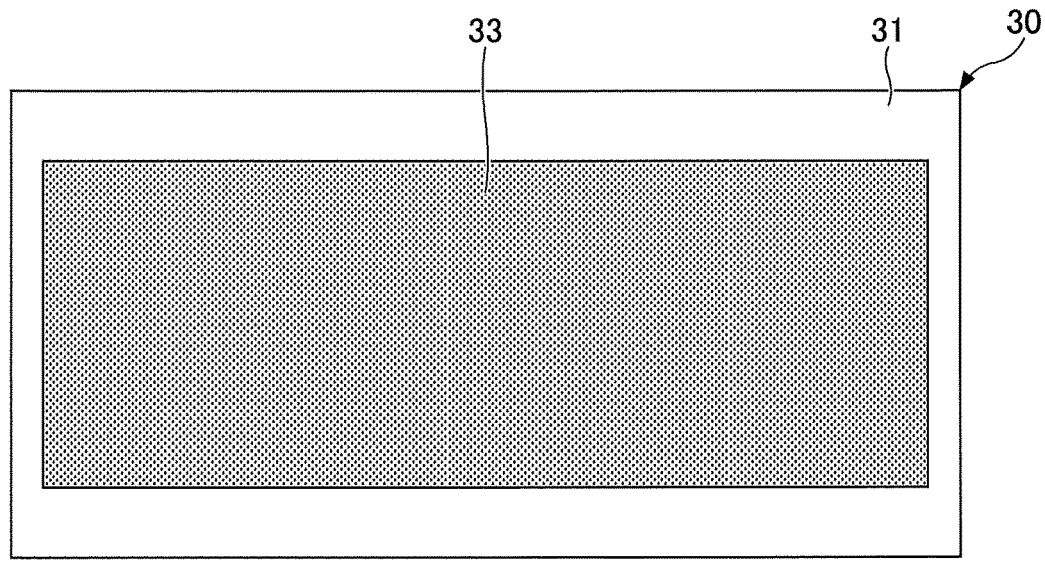
FIG. 31A is a diagram (15) for explaining the processes of the method of manufacturing the semiconductor module according to the third embodiment of the present disclosure.
Figure 31B:
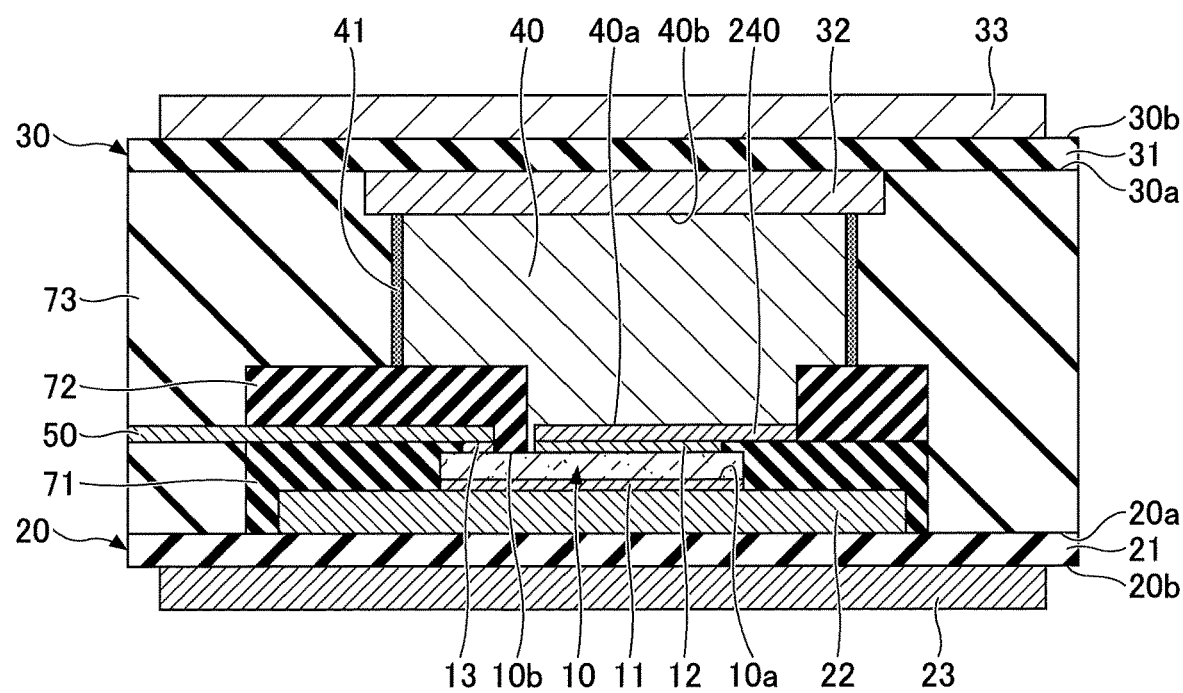
FIG. 31B is a diagram (16) for explaining the processes of the method of manufacturing the semiconductor module according to the third embodiment of the present disclosure.

Next, as illustrated in FIG. 31A and FIG. 31B, the space between the first substrate 20 and the second substrate 30 is filled with the insulating resin section 73.

The semiconductor module according to this embodiment can be manufactured by the processes described above.

Unless otherwise indicated, the features of this embodiment are the same as those of the first embodiment.

Although the embodiments are described in detail above, the present invention is not limited to the particular embodiments, and various variations and modifications may be made without departing from the scope of the present invention.

DESCRIPTION OF THE REFERENCE NUMERALS

10 Semiconductor chip
10a First surface
10b Second surface
11 Drain electrode pad
12 Source electrode pad
13 Gate electrode pad
20 First substrate
20a First surface
20b Second surface
21 Insulating substrate
22 Metal layer
23 Metal layer
30 Second substrate
30a First surface
30b Second surface
31 Insulating substrate
32 Metal layer
33 Metal layer
40 Source conductor section
40a One side
40b Other side
41 Frame section
41a Opening
50 Gate electrode terminal
71 Resin layer
71a Opening
72 Resin layer
72a Opening
73 Insulating resin section
140 Source metal plate
240 Source auxiliary terminal
910 Semiconductor chip
910a First surface
910b Second surface
911 Drain electrode pad
912 Source electrode pad
913 Gate electrode pad
920 Circuit board
920a First surface
920b Second surface
921 Insulating substrate
922a Interconnect layer
922b Interconnect layer
922c Interconnect layer
923 Heat dissipation layer
931 Bonding wire
932 Bonding wire
941 Electrode terminal
942 Electrode terminal
970 Resin material

The invention claimed is:

1. A semiconductor module comprising:
   a semiconductor chip having a first surface provided with a first electrode pad, and a second surface opposite to the first surface and provided with a second electrode pad;
   a first substrate electrically connected to the first electrode pad;
   a second substrate arranged at a position closer to the second surface than to the first surface; and
   a conductor section having a third surface in direct contact with the second electrode pad, and a fourth surface opposite to the third surface and electrically connected to the second substrate, thereby electrically connecting the second electrode pad and the second substrate,
   wherein the conductor section is a one-piece member, made of a conductive material, and having a size greater than the second electrode pad in a plan view viewed from the side of the second substrate.

2. The semiconductor module as claimed in claim 1, wherein the size of the conductor section is greater than the semiconductor chip in the plan view viewed from the side of the second substrate.

3. The semiconductor module as claimed in claim 1, further comprising:
   a third electrode pad provided on the second surface; and
   a first electrode terminal electrically connected to the third electrode pad,
   wherein the first electrode terminal has a flat shape, and extends parallel to the first substrate and the second substrate, between the first substrate and the second substrate.

4. The semiconductor module as claimed in claim 3, wherein the conductor section and the third electrode pad overlap in the plan view viewed from the side of the second substrate.

5. The semiconductor module as claimed in claim 1, further comprising:

a frame section, formed by a material different from the conductive material of the conductor section, provided on a portion of a periphery of the conductor section.

6. The semiconductor module as claimed in claim 1, wherein the second electrode pad includes
a source electrode pad that is provided on the second surface of the semiconductor chip, and
a source metal plate that is provided on and extends parallel to the source electrode pad,
wherein source metal plate makes direct contact with the third surface of the conductor section.

7. The semiconductor module as claimed in claim 1, further comprising:
a second electrode terminal electrically connected to the second electrode pad,
wherein the second electrode terminal and the conductor section are electrically connected.

8. The semiconductor module as claimed in claim 1, wherein the semiconductor chip is formed by a material including SiC.

9. The semiconductor module as claimed in claim 2, further comprising:
a third electrode pad provided on the second surface; and
a first electrode terminal electrically connected to the third electrode pad,
wherein the first electrode terminal has a flat shape, and extends parallel to the first substrate and the second substrate, between the first substrate and the second substrate.

10. The semiconductor module as claimed in claim 9, wherein the conductor section and the third electrode pad overlap in the plan view viewed from the side of the second substrate.

11. The semiconductor module as claimed in claim 9, further comprising:
a frame section, formed by a material different from the conductive material of the conductor section, provided on a portion of a periphery of the conductor section.

12. The semiconductor module as claimed in claim 9, wherein the second electrode pad includes
a source electrode pad that is provided on the second surface of the semiconductor chip, and
a source metal plate that is provided on and extends parallel to the source electrode pad,
wherein source metal plate makes direct contact with the third surface of the conductor section.

13. The semiconductor module as claimed in claim 9, further comprising:
a second electrode terminal electrically connected to the second electrode pad,
wherein the second electrode terminal and the conductor section are electrically connected.

14. The semiconductor module as claimed in claim 9, wherein the semiconductor chip is formed by a material including SiC.

15. The semiconductor module as claimed in claim 2, further comprising:
a frame section, formed by a material different from the conductive material of the conductor section, provided on a portion of a periphery of the conductor section.

16. The semiconductor module as claimed in claim 2, wherein the second electrode pad includes
a source electrode pad that is provided on the second surface of the semiconductor chip, and
a source metal plate that is provided on and extends parallel to the source electrode pad,
wherein source metal plate makes direct contact with the third surface of the conductor section.

17. The semiconductor module as claimed in claim 2, further comprising:
a second electrode terminal electrically connected to the second electrode pad,
wherein the second electrode terminal and the conductor section are electrically connected.

18. The semiconductor module as claimed in claim 1, wherein
the first substrate is configured to connect to a first heat sink to dissipate heat generated from the semiconductor chip via the first surface, and
the second substrate is configured to connect to a second heat sink to dissipate heat generated from the semiconductor chip via the second surface.

19. The semiconductor module as claimed in claim 3, wherein
the first substrate is configured to connect to a first heat sink to dissipate heat generated from the semiconductor chip via the first surface, and
the second substrate is configured to connect to a second heat sink to dissipate heat generated from the semiconductor chip via the second surface.

20. The semiconductor module as claimed in claim 5, wherein
the first substrate is configured to connect to a first heat sink to dissipate heat generated from the semiconductor chip via the first surface, and
the second substrate is configured to connect to a second heat sink to dissipate heat generated from the semiconductor chip via the second surface.

21. The semiconductor module as claimed in claim 1, wherein the conductive material is silver paste.

22. The semiconductor module as claimed in claim 1, wherein the third surface and the fourth surface of the conductor section are parallel to each other.

23. The semiconductor module as claimed in claim 1, wherein the fourth surface of the conductor section has an area greater than an area of the third surface of the conductor section.

24. The semiconductor module as claimed in claim 1, wherein the conductor section has a height, from the third surface to the fourth surface, in a range of 10 mm to 20 mm.

25. The semiconductor module as claimed in claim 1, further comprising:
a metal plate, provided on the fourth surface of the conductor section, and electrically connected to the second electrode pad.

26. The semiconductor module as claimed in claim 1, further comprising:
a resin layer, formed by an insulating resin material, and covering the second surface of the semiconductor chip excluding a region formed with the second electrode pad,
wherein conductor section continuously covers the resin layer and the second electrode pad.

* * * * *